(12) United States Patent
Ren et al.

(10) Patent No.: US 7,465,494 B2
(45) Date of Patent: Dec. 16, 2008

(54) DENSITY CONTROLLED CARBON NANOTUBE ARRAY ELECTRODES

(75) Inventors: Zhifeng F. Ren, Newton, MA (US); Yi Tu, Belmont, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 434 days.

(21) Appl. No.: 10/424,295

(22) Filed: Apr. 28, 2003

(65) Prior Publication Data

US 2004/0058153 A1    Mar. 25, 2004

Related U.S. Application Data

(60) Provisional application No. 60/376,132, filed on Apr. 29, 2002.

(51) Int. Cl.
*B82B 1/00*    (2006.01)

(52) U.S. Cl. ............... 428/367; 423/447.3; 977/722

(58) Field of Classification Search ............ 423/447.1, 423/447.3; 977/DIG. 1, 938, 722; 428/367
See application file for complete search history.

(56) References Cited

U.S. PATENT DOCUMENTS

| | | | | | |
|---|---|---|---|---|---|
| 4,652,348 | A | * | 3/1987 | Yahalom et al. | 205/104 |
| 5,645,898 | A | * | 7/1997 | Sato et al. | 427/539 |
| 5,872,422 | A | * | 2/1999 | Xu et al. | 313/311 |
| 6,232,706 | B1 | * | 5/2001 | Dai et al. | 313/309 |
| 2002/0160111 | A1 | * | 10/2002 | Sun et al. | 427/248.1 |

OTHER PUBLICATIONS

Callegari et al., *Functionalized Single Wall Carbon Nanotubes/Polypyrrole Composites for the Preparation of Amperometric Glucose Biosensors*, 2004, J. Mater. Chem., vol. 14, pp. 807-810.
Gao et al., *Glucose Sensors Based on Glucose-Oxidase-Containing Polypyrrole/Aligned Carbon Nanotube Coaxial Nanowire Electrodes*, 2003, Synthetic Metals, vol. 137, pp. 1393-1394.
Koehne et al., *The Fabrication and Electrochemical Characterization of Carbon Nanotube Nanoelectrode Arrays*, 2004, J. Mater. Chem., vol. 14, pp. 676-684.
Liang et al., *Direct Electrochemistry of Glucose Oxidase at a Gold Electrode Modified with Single-Wall Carbon Nanotubes*, 2003, Sensors, vol. 3, pp. 544-554.
Loutfy et al., *Aligned Carbon-Nanotubes for Sensor Applications*, 2002, Perspectives of Fullerene Nanotechnology, pp. 311-316.
Sotiropoulou et al., *Carbon Nanotube Array-Based Biosensor*, 2003, Anal. Bioanal. Chem., vol. 375, pp. 103-105.
Wang et al., *Carbon Nanotube Screen-Printed Electrochemical Sensors*, 2004, The Analyst, vol. 129, pp. 1-2.
Wang et al., *Solubilization of Carbon Nanotubes by Nafion Toward the Preparation of Amperometric Biosensors*, 2003, J. Am. Chem. Soc., vol. 125, pp. 2408-2409.
Yun et al., *Nanowire Growth for Sensor Arrays*, 2003, Nanofabrication Technologies, Proceeding of SPIE, vol. 5220, pp. 37-45.
Huang et al., *Effect of Nickel, Iron and Cobalt on Growth of Aligned Carbon Nanotubes*, 2002, Applied Physics A, vol. 74, pp. 387-391.
Liu et al., *Size-Selective Electrodeposition of Mesoscale Metal Particles in the Uncoupled Limit*, 2000, J. Phys. Chem., vol. 104, pp. 9131-9139.
Ren et al., *Growth of a Single Freestanding Multiwall Carbon Nanotube on Each Nanonickel Dot*, Aug. 23, 1999, Applied Physics Letters, vol. 75, No. 8, pp. 1086-1088.
Ren et al., *Synthesis of Large Arrays of Well-Aligned Carbon Nanotubes on Glass*, Nov. 6, 1998, Science, vol. 282, pp. 1105-1107.
Sandmann et al., *Preparation of Silver Nanoparticles on ITO Surfaces by a Double-Pulse Method*, 2000, Journal of Electroanalytical Chemistry, vol. 491, pp. 78-86.
Zach et al., *Nanocrystalline Nickel Nanoparticles*, 2000, Advanced Materials, vol. 12, No. 12, pp. 878-883.
Zoval et al., *Electrochemical Deposition of Silver Nanocrystallites on the Atomically Smooth Graphite Basal Plane*, 1996, J. Phys. Chem., vol. 100, pp. 837-844.
Zoval et al., *Electrochemical Preparation of Platinum Nanocrystallites with Size Selectivity on Basal Plane Oriented Graphite Surfaces*, 1998, J. Phys. Chem., vol. 102, pp. 1166-1175.
International Search Report PCT/US03/13031.
Koehne et al., "The Fabrication and Electrochemical Characterization of Carbon Nanotube Nanoelectrode Arrays", J. Mater. Chem., vol. 14, pp. 676-684, (2004).
Koehne et al., "Ultrasensitive LabelFree DNA Analysis Using an Electronic Chip Based on Carbon Nanotube Nanoelectrode Arrays", Nanotechnology, vol. 14, pp. 12391245, (Oct. 17, 2003).
Li et al., "Bottom-up Approach for Carbon Nanotube Interconnects", Applied Physics Letters, vol. 82, No. 15, pp. 2491-2493, (Apr. 14, 2003).
Li et al., "Carbon Nantoube Nanoelectrode Array for Ultrasensitive DNA Detection", Nano Letters, vol. 3, No. 5, pp. 597-602, (Mar. 22, 2003).
Li et al., "Electronic Properties of Multiwalled Carbon Nanotubes in an Embedded Vertical Array", Applied Physics Letters, vol. 81, No. 5, pp. 910-912, (Jul. 29, 2002).

* cited by examiner

*Primary Examiner*—Stuart Hendrickson
(74) *Attorney, Agent, or Firm*—Greenberg Traurig, LLP; David J. Dykeman; Amy F. Mendel

(57) ABSTRACT

CNT materials comprising aligned carbon nanotubes (CNTs) with pre-determined site densities, catalyst substrate materials for obtaining them and methods for forming aligned CNTs with controllable densities on such catalyst substrate materials are described. The fabrication of films comprising site-density controlled vertically aligned CNT arrays of the invention with variable field emission characteristics, whereby the field emission properties of the films are controlled by independently varying the length of CNTs in the aligned array within the film or by independently varying inter-tubule spacing of the CNTs within the array (site density) are disclosed. The fabrication of microelectrode arrays (MEAs) formed utilizing the carbon nanotube material of the invention is also described.

74 Claims, 13 Drawing Sheets

US 7,465,494 B2

DENSITY CONTROLLED CARBON NANOTUBE ARRAY ELECTRODES

RELATED APPLICATION

This Application claims the benefit of U.S. Provisional Application No. 60/376,132, filed on Apr. 29, 2002. The entire teachings of the above application are incorporated herein by reference.

GOVERNMENT SUPPORT

The invention was supported, in whole or in part, by grant No. DE-FG02-00ER45805 from The Department of Energy, grant Nos. DAAD16-00-C-9227 and DAAD16-02-C-0037 from The US Army Natick Soldier Systems Center, grant No. ECS-0103012 from the National Science Foundation, and by grant No. NIH CA-97945-01 from the National Institute of Health. The Government has certain rights in the invention.

FIELD OF THE INVENTION

The present invention relates generally to aligned carbon nanotube (CNT) materials and methods of forming them. In particular, the present invention concerns CNT materials comprising aligned carbon nanotubes (CNTs) with pre-determined site densities. The present invention also relates generally to catalyst substrate materials and methods for forming aligned CNTs with controllable densities on such catalyst substrate materials and methods for their preparation. The present invention further includes fabrication of films comprising site density controlled vertically aligned CNT arrays with variable field emission characteristics, whereby the field emission properties of the films are controlled by independently varying the length of CNTs in the aligned array within the film or by independently varying inter-tubule spacing of the CNTs within the array (site density). The present invention also includes formulation of microelectrode arrays (MEAs) formed utilizing the carbon nanotube material of the invention.

BACKGROUND OF THE INVENTION

Carbon nanotubes (CNTs) have recently attracted attention because of their unique physical properties. CNTs are lightweight and have high mechanical strength, good thermal conductivity, large surface area, and a high aspect ratios. CNTs with variable electronic properties can be obtained by introducing chirality (the rotation of the symmetry of carbon network along the cylinder axis) in individual tubules, whereby the electronic properties may be varied as a function of their chirality. CNTs have superior electron emitting properties compared to conventional materials. Typical field enhancement factors ranging between 30,000 and 50,000 can be obtained for individual CNT tubules, and between 1,000 and 3,000 for CNT arrays. The field enhancement factors of CNT arrays are much smaller than those for individual CNT tubules to the presence of a planar substrate that is necessarily required for physically supporting the CNT tubules forming an array. The field enhancement factors of dense CNT arrays (large number of CNT tubules per unit area substrate) are even smaller because the electrical field around one tubule is screened by neighboring tubules due to their close proximity.

Utilizing CNTs for microelectrode arrays (MEAs) has not been accomplished in the art. MEAs consisting of hundreds of metal microelectrodes (MEs) with diameter of several micrometers (μm) have been fabricated by lithographic techniques. MEAs show many advantages over the conventional macro electrodes. For example, MEAs have high mass sensitivity, increased mass transport and the decreased influence of solution resistance. However, present MEAs are limited by their poor detection limits and low signal-to-noise (S/N) ratio. Noise level depends on the active surface area of the individual electrode whereas the signal depends on the total surface area of all electrodes. Present MEAs have an inadequate number of electrodes per unit area for offering acceptable S/N ratios. Increasing the number of electrodes per unit area will therefore result in an increase in the S/N ratios and improve detection limits. Arrays of vertically aligned CNTs have the good material properties and size (about 20 nm to about 200 nm) for MEAs, but do not have the needed inter-tubule distances within the array (site density). The spacing between individual CNT tubules needs to be sufficiently large in comparison with the diameter of the individual CNT tubules to make each CNT tubule work as an individual nanoelectrode. Reducing the size of each individual electrode to nanometer scale and increasing the total number of electrodes per unit area should improve detection limits and S/N ratio.

For aligned CNTs, tuning of CNT characteristics such as diameter, length and inter-tubule distances within the array (site density) is important for certain electrical and electronic applications, such as field emission and nanoelectrode arrays, due to the shielding effect in a dense array. Since the field enhancement of carbon nanotube film is affected by the length of carbon nanotubes and the spacing between them, it is important to characterize the effect of length and spacing on field emission properties in order to obtain a high and uniform field emission current at low electric field. The effect of length and spacing is known for randomly oriented CNT films and vertically aligned carbon nanotube films. The utility of such randomly oriented CNT films is limited because CNT tubule length, CNT tubule diameter, and CNT tubule spacing cannot be independently varied, so that effect of CNT tubule length, CNT tubule diameter, and CNT tubule spacing (site density) on field enhancement, were not clearly independent. The independent control of such parameters which is important for field enhancement, is therefore not possible using the methods known in the art.

Syntheses of CNTs wherein the individual tubules are organized in a random or aligned manner are known in the art. Although tubule diameter and tubule length of aligned CNTs have been controlled by controlling site densities, catalyst particle size and the growth time, respectively, such methods have been unsuccessful in controlling CNT densities. Furthermore, the present methods which attempt to reduce catalytic site density by electron beam lithography, photolithography, micro contact printing, and shadow mask techniques have limited utility especially in terms of commercial viability since they require expensive equipment, are labor intensive, do not achieve uniform site density control over large areas, and are not amenable to incorporation into large-scale production processes.

There is therefore a need for obtaining aligned CNT arrays with controllable site densities over relatively larger surface areas.

SUMMARY OF THE INVENTION

In one aspect, the present invention provides carbon nanotube (CNT) materials comprising arrays of substantially linear carbon nanotubes with controllable site densities having superior electrical properties for electrode fabrication for use in applications such as metal ion detection in environmental analysis devices and as biosensors. In particular the present invention provides a CNT materials comprising arrays of substantially linear CNTs with controllable site densities wherein the arrays are attached to a catalyst substrate material, wherein the carbon nanotubes are aligned with respect to one another within the array.

In another aspect, the present invention also provides methods of making carbon nanotube (CNT) materials comprising arrays of substantially linear carbon nanotubes with controllable site densities. In particular the present invention provides control of site density of CNTs in the aligned CNT arrays of the invention. Control of site density is accomplished by control of the density of the catalytic sites, such as catalytic transition metal microparticles, within a catalyst substrate material. In one embodiment, CNT growth initiated on such catalytic substrate materials provides linear CNT arrays that are aligned and have a pre-determined intertubule distance (site density) that are controlled by the density of catalytic transition metal microparticles within.

In another aspect, the present invention also provides catalyst substrate materials comprising a non-metallic material having deposited thereupon a layer of a metallic material, and a plurality of catalytic transition metal microparticles deposited upon the metallic material with pre-determined densities (site densities).

In another aspect, the present invention also provides methods of making catalyst substrate materials, comprising catalytic nucleation sites per unit area of catalyst substrate surface area (site density), which is controlled by control of the size and density of the catalytic transition metal microparticles.

In one embodiment, the site density of catalytic nucleation sites that include one or more types of catalytic transition metal microparticles that are capable of initiating CNT growth, wherein the number of catalytic transition metal microparticles is varied by pulse current electrochemical deposition (PCED). The nucleation site density and the size of the catalyst metal microparticles are controlled by adjusting the amplitude of the pulse current and duration and electrolyte concentration. In a preferred embodiment, the density of catalytic transition metal microparticles is up to $10^9$ cm$^{-2}$. In another preferred embodiment, the density of catalytic transition metal microparticles is up to $10^{12}$ cm$^{-2}$. The catalyst material comprising catalytic nucleation sites created by the catalytic transition metal microparticles are utilized for the preparation of aligned CNTs having predetermined site densities. CNT growth on the catalytic substrate materials of the invention is initiated by known methods such as for example chemical vapor deposition (CVD). In a currently preferred embodiment, the aligned CNTs with controlled site densities are prepared by using a Plasma Enhanced Chemical Vapor Deposition (PECVD) process. The site density of the aligned CNT arrays of the invention is determined by the site density of the catalytic nucleation sites in the catalyst substrate material, which in turn, is controlled by the site density of the catalytic transition metal microparticles. Pulse current electrochemical deposition of the invention is a relatively inexpensive and effective technique, and is readily scalable over larger areas, for example, tens of linear inches of catalyst substrate material.

In another aspect, the present invention also provides fabrication of electrically conductive thin films with variable field emission characteristics comprising the vertically aligned pre-determined site density CNT arrays, whereby the field emission property of the conductive films is controlled by independently varying either the length of CNT tubules within the aligned arrays forming the film, or the inter-tubule spacing of the individual CNTs within the array (site density). In particular, the present invention provides a method of controlling the shielding effect between individual tubules for field emission devices and microelectrode fabrication. In another aspect, the field emission characteristics of conductive films comprising vertically aligned CNT are compared following the independent variation of the length and the spacing of the CNTs. The macroscopic electric field $E_{mac,1}$ at the current density of 1 mA/cm$^2$ is used as a criterion for the comparison. For a given length of carbon nanotubes, $E_{mac,1}$ is decreased as the spacing of carbon nanotubes are increased, and for a given spacing of carbon nanotubes, $E_{mac,1}$ is decreased as the length of carbon nanotubes are increased except for the very high density carbon nanotube film. It is estimated that $E_{mac,1}$ is nearly saturated to be about 3 V/μm when the site density is lower than about $10^6$ cm$^{-2}$ and the length is longer than about 10 μm.

In another aspect, the present invention also provides microelectrode arrays (MEAs) comprising CNT materials and method of their production. In particular the present invention provides microelectrode arrays (MEAs) comprising an array of substantially linear CNTs with controllable site densities wherein the arrays are attached to a catalyst substrate material, wherein the carbon nanotubes are aligned with respect to one another within the array.

CNTs can be utilized as carbon electrodes that have a wide useful potential range, particularly in the positive direction due to the slow kinetics of carbon oxidation. CNTs can undergo various chemical and electrochemical modifications to produce flexible surfaces to influence reactivity. CNT electrodes can be utilized in both fundamental and applied electrochemistry due to their unique properties such as high aspect ratio and good electrical conductivity.

Catalyst microparticles need to be stable in a plasma environment during carbon nanotubes growth. Therefore, catalyst microparticles should necessarily have a relative large size. There is a need to make large diameter catalyst microparticles on a fairly large area having a low site density.

BRIEF DESCRIPTION OF THE DRAWINGS

FIG. 1(a) shows a site density of 7.5×10$^5$ cm$^{-2}$. FIG. 1(b) shows a site density of 2.0×10$^6$ cm$^{-2}$. FIG. 1(c) shows a site density of 2.0×10$^7$ cm$^{-2}$. FIG. 1(d) shows a site density of 3.0×10$^8$ cm$^{-2}$. The white dots shown in the images are the nickel (Ni) microparticles confirmed by Energy Dispersive X-ray Spectroscopy (EDX).

FIG. 2(a) shows a site density of 7.5×10$^5$ cm$^{-2}$. FIG. 2(b) shows a site density of 2.0×10$^6$ cm$^{-2}$. FIG. 2(c) shows a site density of 6.0×10$^6$ cm$^{-2}$. FIG. 2(d) shows a site density of 2.0×10$^7$ cm$^{-2}$. FIG. 2(e) shows a site density of 3.0×10$^8$ cm$^{-2}$. FIG. 2(f) is an enlarged view a single standing aligned CNT. FIGS. 2(a)-2(e) are shown on a scale of 10 micrometers (μm). FIG. 2(f) is shown on a scale of 1 μm.

FIG. 5(a) shows sample D, FIG. 5(b) shows sample F, FIG. 5(c) shows sample G, and FIG. 5(d) shows sample H. The images show that the CNT films have different site densities and lengths. The white scale bar is corresponds to 10 μm.

FIG. 10(a) shows a catalytic substrate comprising Ni microparticles deposited on a chromium coated silicon substrate. FIG. 10(b) shows an array of aligned carbon nanotube grown on the catalytic substrate, FIG. 10(c) shows a coating of SiO$_2$ and a two-component, solvent-thinned, epoxy-phenolic adhesive (M-Bond 610™), FIG. 10(d) shows exposure of the CNTs after a terminal polishing step.

FIG. 2(a) is a top view, FIGS. 11(b) to 11(f) are side views from a 45° angle. The scale bars represent 5 μm. FIG. 11(a) shows electro-deposited Ni microparticles. FIG. 11(b) shows a low site density aligned CNTs array. FIG. 11(c) shows a CNT array coated with a SiO$_2$ and an epoxy layer. FIG. 11(d) shows a magnified view of a single half embedded CNT, FIG. 11(e) shows CNTs after polishing. FIG. 11(f) shows a second electrodeposition of Ni microparticles on the polished CNTs only.

DETAILED DESCRIPTION OF THE INVENTION

Figure 1:
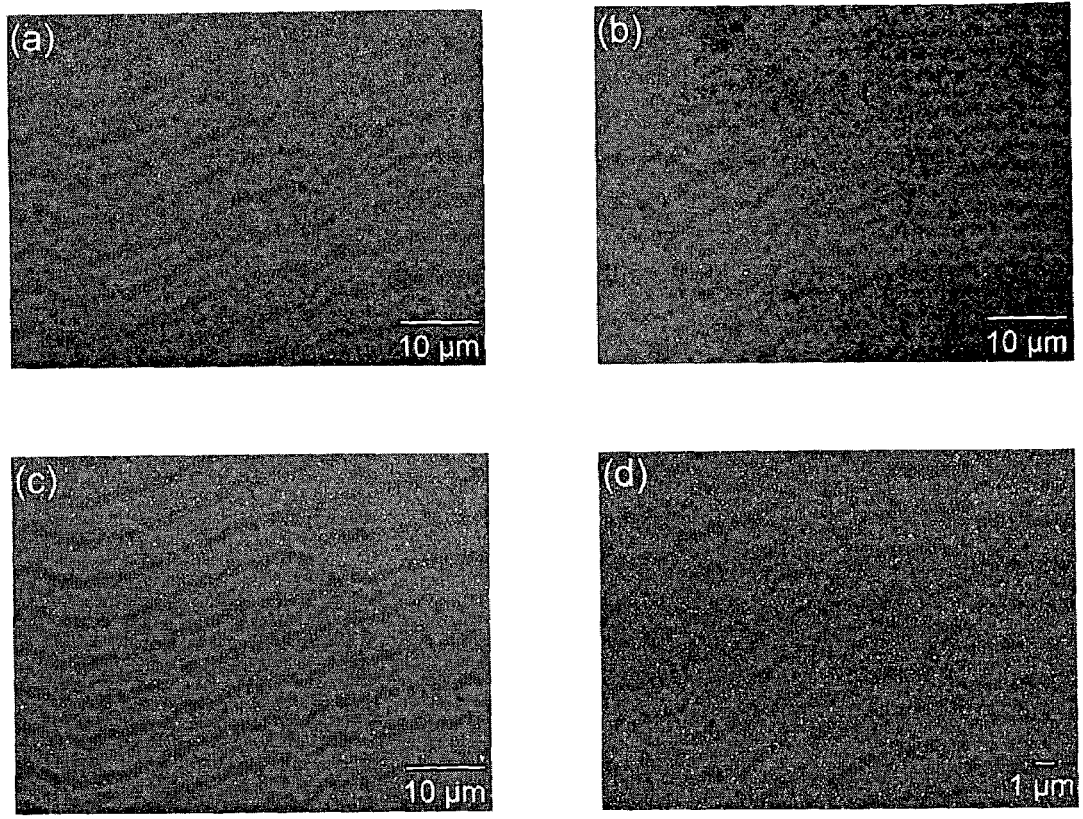
FIG. 1. shows SEM images of nickel (Ni) microparticles deposited electrochemically.

The following definitions are used to describe the various aspects and characteristics of the invention.

As referred to herein CNTs are "aligned" wherein the longitudinal axis of individual tubules are oriented in a plane substantially parallel to one another.

As referred to herein CNTs have a "uniform length" wherein the wherein the length of individual tubules are substantially the same length relative to one another. Depending on growth conditions used, the height of a CNT in an array in a given growth run can be varied in height by about 10% to about 50%. Alternatively, height uniformity is accomplished by performing additional mechanical polish steps. In a preferred embodiment, the CNTs have a uniform length from about 1 to about 20 micrometers. In a particularly preferred embodiment, the CNTs have an average length of about 8 micrometers.

As referred to herein "density" or "site density" denotes units of microparticles or CNT tubules per centimeter squared (cm$^{-2}$). Site density relates the spacing distance between individual microparticles or CNT tubules in an array. For example, a density of about 1×10$^6$ cm$^{-2}$ corresponds to a spacing distance of about 10 micrometers (μm)

As referred to herein "high site density" is a large number of nanoparticle or CNT tubule units per centimeter squared (cm$^{-2}$). Typically a high site density refers to a number greater than about 1.0×10$^{12}$ cm$^{-2}$.

As referred to herein "low site density" is a small number of nanoparticle or CNT tubule units per centimeter squared (cm$^{-2}$). Typically a low site density refers to a number less than or equal to about 1.0×10$^{12}$ cm$^{-2}$.

As referred to herein, a "tubule" is an individual CNT.

As referred to herein, the "aspect ratio" of a CNT is the ratio of tubule length and tubule diameter.

The CNTs as refers to herein have "proximal" and "distal" ends. The proximal ends of the CNTs are attached to a catalyst substrate material.

The term "Linear CNTs" as defined herein, refers to CNTs that do not contain any branches originating from the surface of individual CNT tubules along their linear axes.

The term "Array" as used herein, refers to a plurality of CNT tubules that are attached to a substrate material proximally to one another.

As referred to herein, a "non-metallic material" is any non-conductive material suitable for depositing a metallic layer thereupon. Examples of "non-metallic material" polymers include but are not limited to, silicon, silica, glass, alumina, quartz, polymer and graphite. Examples of polymers include but are not limited to, polyvinyl chloride (PVC), polyacrylate (PA), polypropylene (PP), polymethylmethacrylate (PMMA), polycarbonate (PC) polyethylene (PE) and thermoset plastics. In a preferred embodiment, the non-metallic material is a silicon wafer.

As referred to herein, a "metallic material" can be a metal, metal alloy or mixture thereof. Examples of a metallic material include, but are not limited to, chromium (Cr), molybdenum (Mo), tungsten (W), ruthenium (Ru), copper (Cu), silver (Ag) and gold (Au). In a preferred embodiment, the metallic material is chromium (Cr).

As referred to herein, a "catalytic transition metal" can be any transition metal, transition metal alloy or mixture thereof. Examples of a catalytic transition metal include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (Ir). In a preferred embodiment, the catalytic transition metal comprises nickel (Ni).

As referred to herein, a "catalytic transition metal alloy" can be any transition metal alloy. Preferably, a catalytic transition metal alloy is a homogeneous mixture or solid solution of two or more transition metals. Examples of a catalytic transition metal alloy include, but are not limited to, a nickel/gold (Ni/Au) alloy and a cobalt/iron (Co/Fe) alloy.

"Pulse-Current Electrochemical Deposition" (PCED) is an electrochemical deposition process which utilized a modulated current waveform (a current pulse). PCED can be used to achieve superior leveling of the deposit, and to minimize porosity and contamination. PCED is performed by applying a constant current pulse by using a current source and a voltage source. Both the current source and the voltage source are controlled by any suitable means known in the art including analog and digital controller devices. In a preferred embodiment, the current source and the voltage source is controlled by a computer.

As referred to herein, a "working electrode" is a metallic coated non-metallic substrate for use in depositing a catalytic transition metal. Preferably the working electrode is a chromium (Cr) coated silicon (Si) wafer. The chromium (Cr) coating provides a flat, conductive and defect free surface on the silicon (Si) wafer. A preferred method of preparing a chromium (Cr) coated silicon (Si) wafer comprises sputtering a layer of chromium (Cr) on a silicon (Si) wafer. Preferably the sputtering method is magnetron sputtering.

As referred to herein, a "counter electrode" is any suitable electrically-conductive metal. In a preferred embodiment, the counter electrode comprises a noble metal. Examples of suitable noble metals include, but are not limited to, gold (Au), platinum (Pt) and iridium (Ir). In a particularly preferred embodiment, the counter electrode is gold (Au) plate.

As referred to herein, an "electrolytic solution." comprises a transition metal salt and a mineral acid. Preferably, the transition metal salt is a transition metal sulfate. In a preferred embodiment, the transition metal sulfate is nickel sulfate ($NiSO_4$). Examples of suitable mineral acids include but are not limited to boric acid ($H_3BO_3$), nitric acid ($HNO_3$), hydrochloric acid (HCl) and sulfuric acid ($H_2SO_4$). Preferably the electrolytic solution is weekly acidic. In a preferred embodiment, the mineral acid is boric acid ($H_3BO_3$). In a currently preferred embodiment, the electrolytic solution comprises 0.01 M nickel sulfate ($NiSO_4$) and 0.01 M boric acid ($H_3BO_3$) in double distilled water.

The term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules may then be deposited on a nearby substrate (the "D" in CVD), with the rest pumped away. Examples of CVD methods include but not limited to, "plasma enhanced chemical vapor deposition" (PECVD), "hot filament chemical vapor deposition" (HFCVD), and "synchrotron radiation chemical vapor deposition" (SRCVD).

As referred to herein, a "promoter gas" component of the of the invention can be a substance that is a gaseous compound at the reaction temperatures, and preferably comprises a non-carbon gas such as ammonia, ammonia-nitrogen, hydrogen, thiophene, or mixtures thereof. The promoter gas of the present invention may be diluted by mixing it with a diluent gas, which are primarily unreactive, oxygen-free gases, such as for example, hydrogen, helium, nitrogen, argon, neon, krypton, xenon, hydrogen sulfide, or combinations thereof. For the CVD reaction process of the present invention, hydrogen is preferred for reaction temperatures maintained at less than about 700° C., while for higher temperatures (greater than or equal to about 700° C.), the promoter gas is chosen from ammonia, hydrogen, nitrogen, or any combination thereof. The promoter gas can be introduced into the reaction chamber of the reaction apparatus (e.g. the CVD reaction chamber) at any stage of the reaction process. Preferably, the promoter gas is introduced into the reaction chamber either prior to or simultaneously with the carbon source gas. The CNT nanotube nucleation process on the catalyst substrate is catalyzed by the promoter gas of the present invention enables every metal catalyst "cap" that is formed within individual tubules to catalyze their efficient and rapid growth.

As referred to herein, a "carbon source gas" of the present invention can be saturated, unsaturated linear branched or cyclic hydrocarbons, or mixtures thereof, that are in either in the gas or vapor phase at the temperatures at which they are contacted with the catalyst substrate material (reaction temperature). Preferred carbon source gases include methane, propane, acetylene, ethylene, benzene, or mixtures thereof. In a currently preferred embodiment, the carbon source gas for the synthesis of linear CNTs is acetylene.

As referred to herein, an "insulator" can be any a non-conducting or insulating material. Preferably, the insulator has a low porosity, a high density and is substantially defect free. Examples of an insulator include high-density polymers, and metal oxides. In a preferred embodiment, the insulator is silicon dioxide ($SiO_2$).

As referred to herein, an "adhesive" can be a non-conducting or insulating bonding material. Examples of a non-conducting bonding material include, but are not limited to, epoxy resins, glue gums, cementing agents, etc. In a preferred embodiment, the non-conducting bonding material is an epoxy resin. In a particularly preferred embodiment, the epoxy resin is a two-component, solvent-thinned, epoxy-phenolic adhesive (M-Bond 610™). In another particularly preferred embodiment, the epoxy resin is a bisphenol A/ epichorohydrin derived liquid epoxy resin (Epon resin 828™) (Miller-Stephenson Chemical Company, Inc.).

In one aspect, the present invention relates to a CNT material comprising an array of substantially linear carbon nanotubes with controllable site densities, wherein the individual tubules within the arrays are attached to a catalyst substrate material, in a manner as to be aligned with respect to one another within the array. In one embodiment, the CNT material comprises an array of substantially linear carbon nanotubes with pre-determined densities that are attached to a catalyst substrate material, wherein said carbon nanotubes are aligned with respect to one another within the array.

In another aspect, the present invention relates to a catalyst substrate material whereupon the CNT material is produced. In one embodiment, the catalyst substrate material comprises a non-metallic material having deposited thereupon a layer of a metallic material, and a plurality of catalytic transition metal microparticles deposited upon said metallic material with pre-determined densities.

Another aspect of the invention relates to a method of forming a catalyst substrate material comprising a non-metallic material having deposited thereupon a layer of a metallic material, and a plurality of catalytic transition metal microparticles deposited upon the metallic material with pre-determined densities. In one embodiment, the catalytic transition metal microparticles deposited upon the metallic material using.

Many factors with PCED can affect the deposited microparticles, including the composition of the electrolyte solution; the surface morphology of the substrate; the magnitude of the applied pulse current density and the duration time. Lowering the concentration of transition metal ions will decrease both the nucleation site density and the size of the deposited catalytic transition metal microparticles.

Varying mineral acid concentrations, such as boric acid concentrations, changes the pH value. Solutions with a support electrolyte (potassium chloride) added are tested and it is found only when the concentration of mineral acid is very low and no other support electrolyte is added, the catalytic transition metal microparticles with low site density and large size (larger than 100 nm in diameter) are achieved. When the mineral acid concentration increases or some other support electrolyte is added, the conductivity of the solution increases, and the electrodeposited catalytic transition metal microparticles have higher density and smaller size. The surface morphology of the substrate also affects the distribution of the deposited catalytic transition metal microparticles. Microparticles form easily on the defect site of the substrate with high site density. In order to eliminate the aggregation of the microparticles, a sputtering method is used to coat a thin layer of metallic material such as chromium (Cr) on the non-metallic substrate material such as a silicon (Si) wafer to obtain a conductive and defect free surface.

When the solution composition and the substrate are fixed, the site density and the size of the transition metal microparticles are determined by the combined effect of applied pulse current density and duration time. High current density and long duration time result in high site density and large particles (greater than about 100 nm).

In one embodiment, the size distribution of the electrochemical deposited catalytic transition metal microparticles is quite large. Both large particles (greater than about 100 nm) and small particles (less than about 50 nm) are deposited on the substrate. The small particles are removed by plasma etching before the growth of CNTs.

In another embodiment, PCED is performed by applying a constant current pulse to a two electrode system comprising a working electrode and a counter electrode. The working electrode and the counter electrode are spaced at a suitable distance. In a preferred embodiment, the two electrodes are spaced at suitable distances, typically of about 1 cm. PCED is performed at any suitable temperature. In a preferred embodiment, the PCED is performed at room temperature.

In a preferred embodiment, PECD is carried out on a two electrode system, wherein the distance between the two electrodes is maintained at about 1 cm, and a constant current pulse is applied by using a current source and a voltage source, both of which are controlled by the computer program. The working electrode is prepared by sputtering a layer of chromium on a silicon wafer thereby obtaining a flat, conductive and defect free surface. Gold plate is used as counter electrode. About 1 cm$^2$ of the working electrode surface is exposed to a weekly acidic electrolyte solution comprising 0.01 M NiSO$_4$ (0.01M Ni$^{2+}$) and 0.01 M H$_3$BO$_3$ in double distilled water at room temperature.

Another aspect of the invention relates to a method of forming a CNT material comprising an array of substantially linear carbon nanotubes with pre-determined densities that are attached to a catalyst substrate material, wherein the CNTs are aligned with respect to one another within the array.

CNTs can be grown by any suitable method known in the art. For example, CNTs can be grown by any chemical vapor deposition (CVD) method, including but not limited to, plasma enhanced chemical vapor deposition (PECVD), hot filament chemical vapor deposition (HFCVD) or synchrotron radiation chemical vapor deposition (SRCVD). It has been discovered that CNT tubules with substantially improved alignment can be obtained by the methods of invention by inclusion of a plasma during the CNT growth process. In a preferred embodiment the CNTs are grown from the transition metal microparticles by a PECVD process.

In one embodiment, CNTs of the present invention are obtained by placing a catalyst substrate material, which is formed by electrochemical deposition of a catalytic transition metal microparticles, with a pre-determined site density, on a metal coated non-metallic substrate material, within a PECVD chamber known in the art, following which CNT growth is initiated on the surface of the catalyst substrate material by standard methods described in the art. (see for example Z. F. Ren, et al., *Science*, 282, 1105 (1998); Z. P. Huang, et al., *Appl. Phys. A: Mater. Sci. Process*, 74, 387 (2002); and Z. F. Ren et al., *Appl. Phys. Lett.*, 75, 1086 (1999), the contents of which are incorporated herein by reference in their entirety).

CNT tubule diameter, tubule length, number of concentric graphene layers (graphitization) comprising individual tubules and the yield of the CNTs is controlled by varying the reaction temperature of CNT synthetic process.

Production of linear CNT materials is accomplished by placing a catalysts substrate into the reaction chamber of a CVD apparatus and exposed to a flow of a gas mixture containing the carbon source gas and a promoter gas. The reaction temperature, gas pressure and reaction time are maintained under pre-determined conditions effective to cause formation and growth of a plurality of carbon nanotubes on the catalyst substrate surface. The CVD chamber temperature and gas pressure are optimized to control and obtain the desired the morphology of carbon nanotubes during their growth.

The catalyst substrate material can be used in the CNT synthetic process either by itself to cause reaction of the carbon source gas, or in combination with the promoter gas that is mixed with the carbon source gas.

The manufacturing methods of the invention also enable the tailoring of linear CNT morphology by controlling gas pressure. At relatively low pressures, CNTs with a tubular hollow structure can be obtained, whereas at relatively high pressures, CNTs with "bamboo-like" structure and increased compartmental density can be obtained. The number of graphene layers, which is related to thickness of the tubule wall and diaphragm of the CNTs, can also be controlled during their formation by control of gas pressure. Once the first layer forms as a bamboo-like structure, all subsequent layers terminate on the surface of the CNT.

The methods of the present invention allow the process parameters for catalyst substrate material and CNT formation to be varied optimally, thereby enabling controllable formation of catalyst substrate materials and CNTs with pre-determined site densities and morphologies.

In the PECVD method, the transition metal microparticles are subjected to the plasma. Plasma is utilized to direct the CNTs growth direction.

In one embodiment, the catalyst substrate is optionally etched prior to CNT growth to substantially reduce the number of transition metal microparticles that have a diameter smaller than 50 nanometers. The plasma etches the catalyst substrate and at the same time assists the CNT growth.

The morphology of the CNTs is related to the size of the transition metal microparticles. When the diameter of the transition metal microparticles is smaller than 50 nanometers, either no CNTs or only short and curved CNTs are grown. When the size of the transition metal microparticles is large, well-aligned CNTs with uniform length distribution are grown. As stated above, both small and large transition metal microparticles are presented on the substrate after electrochemical deposition. In order to substantially eliminate the small particles, an optional etching step is preformed by applying low intensity plasma to the substrate for a short time before the introduction of acetylene gas. In a preferred embodiment, the catalyst substrate is etched by applying 100 Watts of direct current (DC) plasma is for about 10 to about 20 seconds. After the etching, the small particles are removed and the other large particles become smaller.

In one embodiment, a catalytic substrate, formed by PECD of Ni microparticles, is placed in a PECVD chamber. The pressure in the chamber is reduced to $2 \times 10^{-6}$ Torr, then about 160 standard cubic centimeter per minute (sccm) ammonia ($NH_3$) gas is introduced into the chamber and the temperature is increased by applying current on the tungsten filament. In a preferred embodiment, 100 Watts DC plasma is applied for about 10 to about 20 seconds first to etch the Ni microparticles, then 40 sccm acetylene ($C_2H_2$) gas is introduced and the plasma intensity is increased to about 170 Watts for the aligned CNT growth. The pressure during growth is about 15 Torr. The growth time is about 5 minutes, and the sample temperature during growth is below about 660° C. The CNT material comprises mostly aligned CNTs with uniform length and pre-determined site density.

Scanning electron microscopy (SEM) is employed to examine the morphology. Transmission electron microscopy (TEM) is used to characterize the structure of the CNTs by standard methods.

The CNT array materials, the catalyst substrate materials on which the CNT arrays are formed, the methods of forming the catalyst substrate material, and the methods of forming the CNT arrays utilizing the catalyst substrate material, are described in detail by reference to the following figures and diagrams.

FIG. 1 shows the different nucleation site densities of Ni microparticles having various site densities between about $7.5 \times 10^5$ $cm^{-2}$ and about $3 \times 10^8$ $cm^{-2}$. The white dots shown in the pictures are the Ni microparticles that are confirmed by Energy Dispersive X-ray Spectroscopy (EDX). The figure shows that most of the Ni microparticles have a diameter between about 100 nm and about 200 nm with some microparticles having a diameter smaller than about 50 nm. The figure also shows that the Ni microparticles produced by the methods of the invention are randomly located on the surface of the catalyst substrate material.

Figure 2:
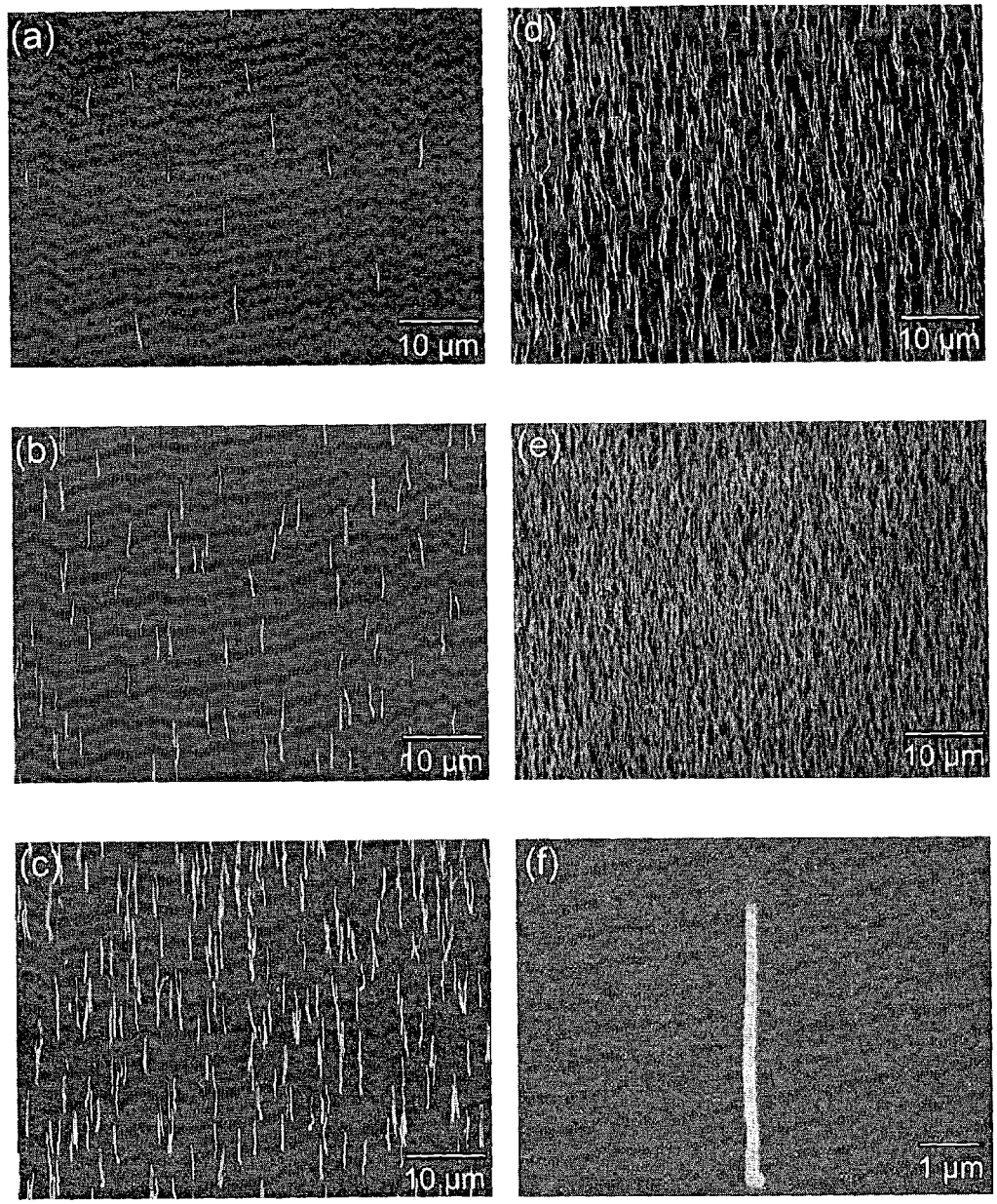
FIG. 2. shows SEM images of aligned CNTs having various site densities of CNTs grown from electrodeposited Ni microparticles.

FIG. 2 shows CNT arrays having various site densities. The CNT arrays shown in FIG. 2 are formed by PECVD methods utilizing the catalyst substrate materials shown in FIG. 1. It is shown that the pre-determined site density of the CNT tubules is controlled by the pre-determined site density of the transition metal microparticles of the catalyst substrate. FIGS. 2 (a) to (e) shows the different site densities of CNTs grown from the electrodeposited Ni microparticles. The CNT site densities of the samples are about $7.5 \times 10^5$ $cm^{-2}$ (FIG. 2(a)), $2.0 \times 10^6$ $cm^{-2}$ (FIG. 2(b)), $6.0 \times 10^6$ $cm^{-2}$ (FIG. 2(c)), $2.0 \times 10^7$ $cm^{-2}$ (FIG. 2(d)), and $3 \times 10^8$ $cm^{-2}$ (FIG. 2(e)). FIG. 2 (f) provides a expanded view of an individual CNT.

Figure 3:
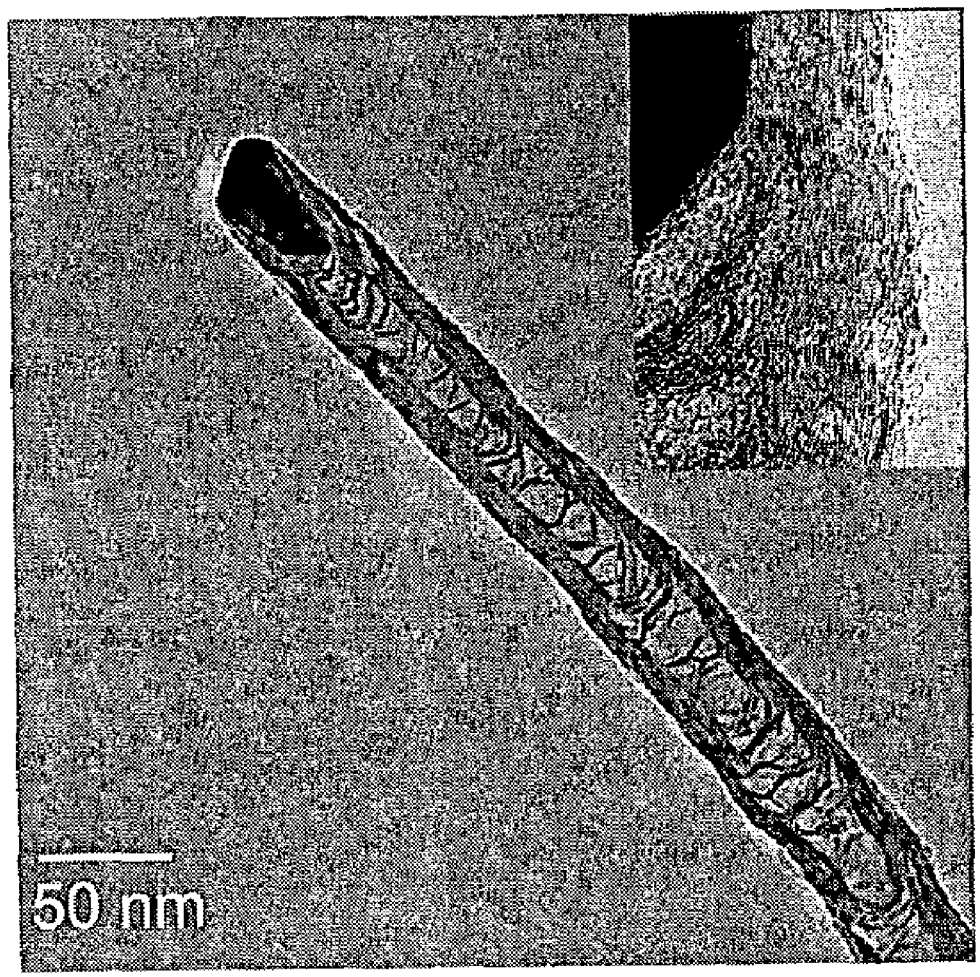
FIG. 3. shows a TEM micrograph of a single aligned CNT tubule with a bamboo morphology, and its similarity to the CNT tubules grown on Nickel (Ni) thin films.

FIG. 3 shows a typical TEM micrograph of a CNT grown by the methods of the invention. The image shows that the CNTs have a bamboo-like structure, which is similar with that of the CNTs grown from Ni thin films prepared by sputtering using similar PECVD methods. FIG. 3 shows that the microstructure does not depend on the way the Ni catalyst is prepared.

Figure 4:
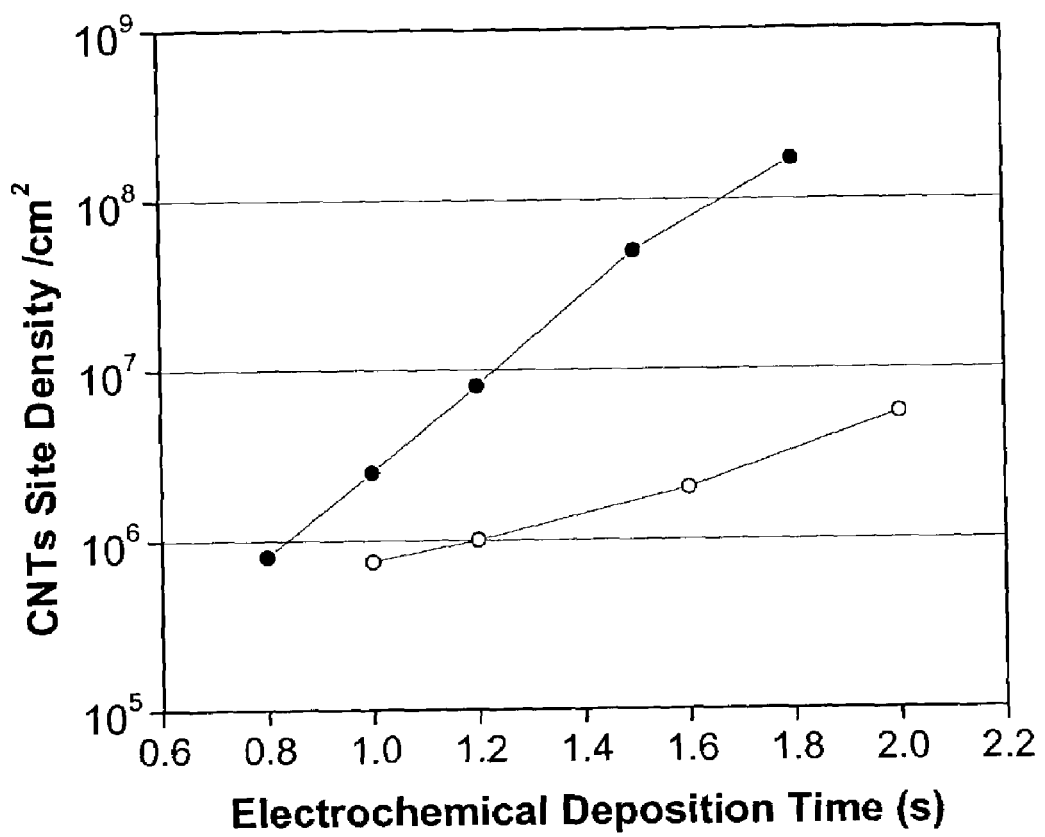
FIG. 4. shows CNT site density dependence of electrochemical deposition current density on deposition time at current density of 1.0 mA/cm$^2$. Filled circles represent a deposition current fixed at 2.0 mA/cm$^2$. Open circles represent a deposition current fixed at 1.0 mA/cm$^2$.

FIG. 4 shows that by adjusting the current density and the deposition time, aligned CNTs with site density from about $1 \times 10^5$ to about $1 \times 10^8$ $cm^{-2}$ are achieved. FIG. 4 shows that CNT site density is dependent on electrochemical deposition current density and deposition time. For example, at a current density of about 1.0 mA/$cm^2$, the CNTs site density increases to about 8 times when the deposition time increases from about 1.0 to about 2.0 seconds, whereas at a deposition time of about 2.0 mA/$cm^2$, the CNTs site density increased greater than about 100 times when the deposition time increases from about 0.8 to about 1.8 seconds.

Another aspect of the present invention relates to fabrication of films comprising vertically aligned CNT electrodes with variable field emission characteristics, whereby the field emission properties of the films are controlled by independently varying the length of CNTs in the aligned array within the film or by independently varying inter-tubule spacing of the CNTs within the array (site density). Vertically aligned CNT electrodes comprise the CNT materials of the present invention comprising an array of substantially linear carbon nanotubes with controllable site densities, wherein the individual tubules within the arrays are attached to a catalyst substrate material, in a manner as to be aligned with respect to one another within the array. The inter-tubule spacing of the CNTs within the array are varied by controlling the site density of the catalytic transition metal microparticles upon which the CNTs are grown.

The intrinsic field enhancement factor $\gamma_0$ of an individual carbon nanotube in planar diode configuration, which is defined as the ratio of the local electric field at the tip of carbon nanotube to the macroscopic electric field, is approximated by Equation (1).

$$\gamma_0 = 1.2(l/r+2.15)^{0.9} \tag{1}$$

wherein l and r are the length and the radius of carbon nanotube, respectively. Equation (1) represents $\gamma_0$ calculated using the computer program CIELAS2™ Granta Electronics, Cambridge, U.K.), which simulates the electrostatic field distribution based on the finite element method for the cylindrical tube with hemispherical end in the range of $4 \leq l/r \leq 3000$ with the accuracy of ±3%.

Taking into consideration the effect of spacing between carbon nanotubes, the field enhancement factor $\gamma$ of carbon nanotube film can be approximated by Equation (2)

$$\gamma = \gamma_0(1-\exp(-2.3172s/l)) \tag{2}$$

wherein s is the spacing between carbon nanotubes. Equation (2) represents $\gamma$ calculated using the computer program MACSIMION Version 2.04 that simulates the electrostatic field distribution for the uniformly spaced square array of cylindrical tubes with hemispherical end.

This field enhancement factor is experimentally determined from the slope of Fowler-Nordheim plot if the work function is known, and is used to compare the field emission characteristics of carbon nanotubes with different length and spacing. However, the field enhancement factor extracted from the Fowler-Nordheim plot is affected by the adsorbates and/or by the geometry of configuration, so that the comparison based on the field enhancement factor determined from the Fowler-Nordheim plot can result in error.

Therefore, another parameter, local electric field, $E_{local}$, is used in to compare the field emission from carbon nanotubes with different length and spacing. $E_{local}$ is defined as the electric field at the tip of carbon nanotubes when the emission current density reaches a certain value. It is known that $E_{local}$ is nearly constant over samples fabricated by the same method and is related to the macroscopic electric field $E_{mac}$ by the field enhancement factor. As a result, a comparison of $E_{mac}$'s at certain current density for carbon nanotube films with different length and spacing, indirectly compares the field enhancement factors of those carbon nanotubes films. The current density is chosen to be 1 mA/$cm^2$ because it is the minimum current density required to obtain the brightness of 300 cd/$m^2$ from a VGA display with a typical high voltage phosphor screen efficiency of 9 lm/W. The macroscopic electric field and the local electric field to obtain the current density of 1 mA/$cm^2$ are denoted by $E_{mac,1}$ and $E_{local,1}$, respectively. As $E_{local,1}$ is proportional to $E_{mac,1}$, and the proportionality constant is given by Equation (1) and Equation (2), $E_{mac,1}$ is related to the length and spacing of carbon nanotubes by Equation (3).

$$E_{mac,1}=E_{local,1}/[1.2(l/r+2.15)^{0.9}(1-\exp(-2.3172s/l))] \quad (3)$$

Since $E_{local,1}$ can be regarded as a constant, $E_{mac,1}$ given by Equation (3) is used to compare the field emission from carbon nanotube films with varying length and spacing.

Firstly, $E_{mac,1}$'s for samples of varied site density CNT arrays (shown as A-G) are plotted in FIG. 3 in order to investigate the effect of the length of carbon nanotubes on emission properties. $E_{mac,1}$ for sample H is not included in this plot because the carbon nanotube density of sample H is much higher than the other samples. The measured data show that the same current density is obtained at lower macroscopic electric field as the length of carbon nanotubes is increased.

Figure 7:
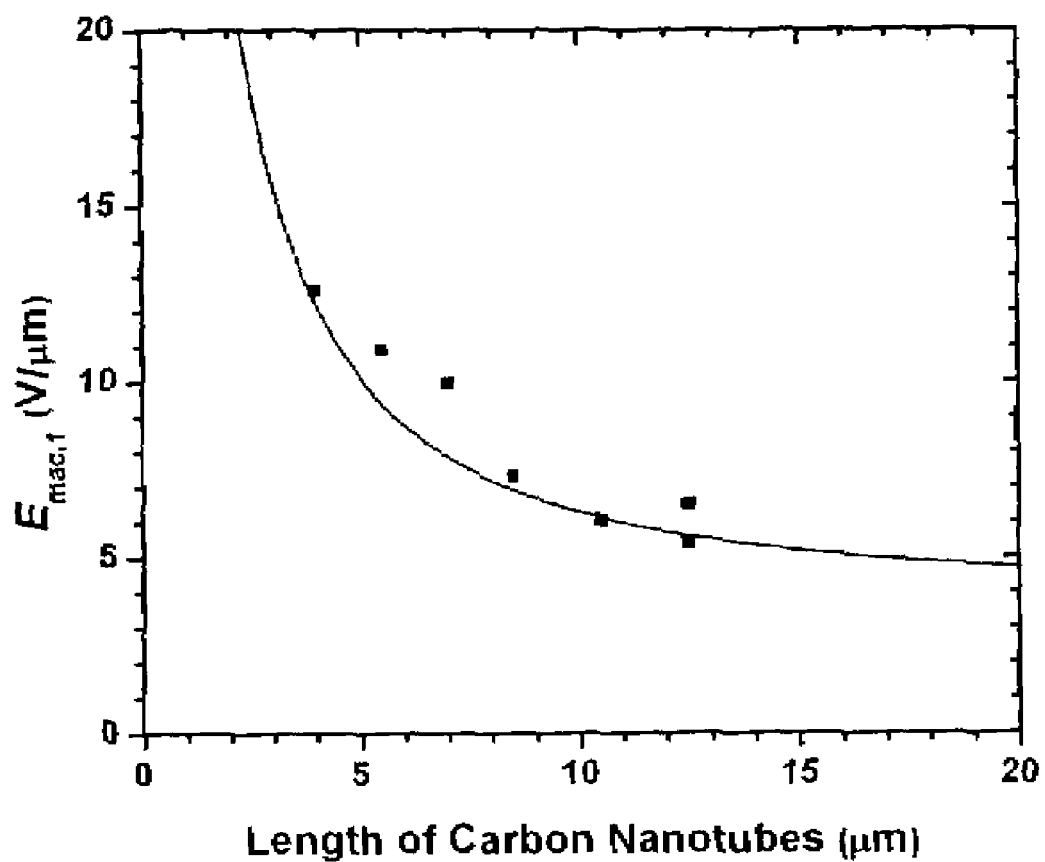
FIG. 7. shows the change in macroscopic electric fields $E_{mac,1}$ at the average current density of 1 mA/cm$^2$ as a function of the length of carbon nanotubes. The horizontal axis represents length of CNTs (μm). The vertical axis represents $E_{mac,1}$ (V/μm).

In FIG. 7, the dotted curve represents Equation (3) wherein r=8 nm, s=8 μm, and $E_{local,1}$=3.9 V/nm. The agreement of the experimental data with Equation (3) is satisfactory, even considering that the samples have non-uniformity regarding length, spacing, and radius. Due to this non-uniformity of the size of the nanotubes in the carbon nanotube film, only some preferred nanotubes with longer length and smaller radius can take part in the field emission. The spacing, s=8 μm, used in the calculation of the dotted curve in FIG. 7 is within the range of spacing between nanotubes of 4-10 μm calculated from the density of carbon nanotubes shown in Table 1. In addition, $E_{local,1}$=3.9 V/nm at the average current density of 1 mA/cm² is quite similar to $E_{local,1}$=4.1 V/nm calculated from known data.

Figure 8:
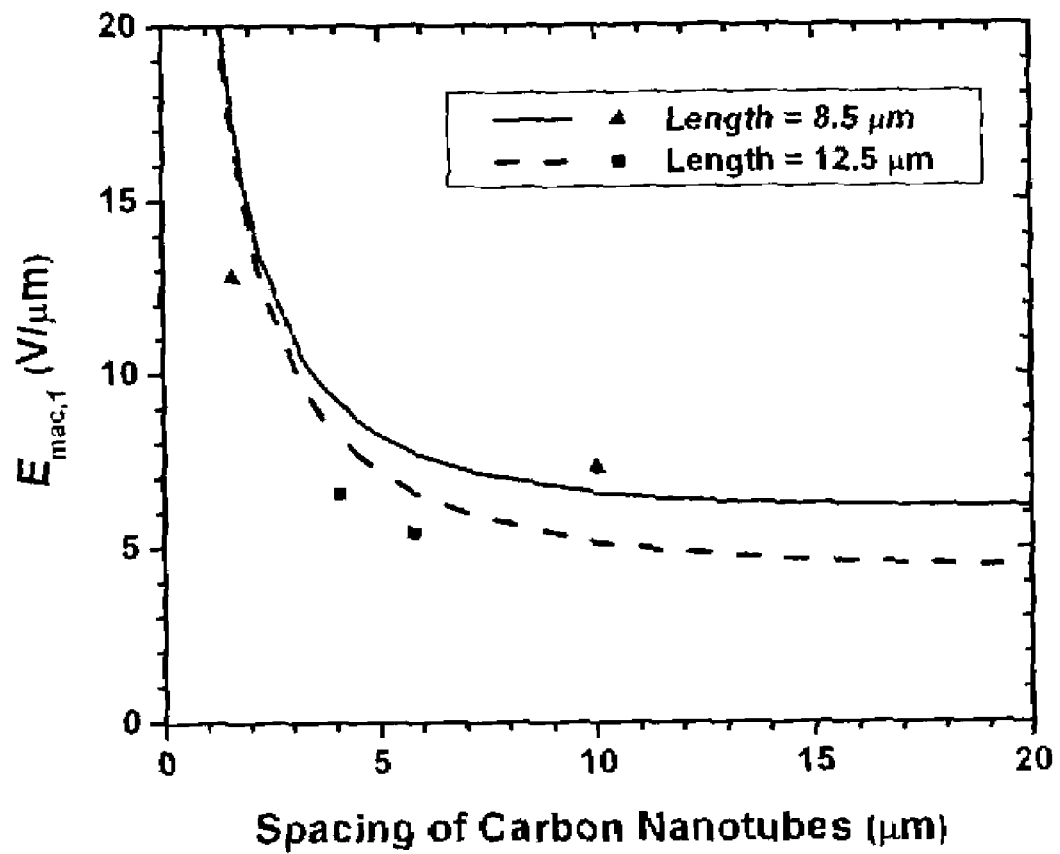
FIG. 8. shows the change in macroscopic electric fields $E_{mac,1}$ at the average current density of 1 mA/cm$^2$ as a function of the spacing of carbon nanotubes. Triangles, -▲-, represent samples D and H, and squares, -■-, represent samples F and G. The horizontal axis represents spacing of CNTs (μm). The vertical axis represents $E_{mac,1}$ (V/μm).

Secondly, $E_{mac,1}$'s for sample D, F-H are plotted in FIG. 8 in order to investigate the effect of the spacing of carbon nanotubes on emission properties. In FIG. 8, the solid and the dotted curves represent Equation (3) with l=8.5 μm and 12.5 μm, respectively. Other parameters are r=8 nm and $E_{local,1}$=3.9 V/nm. The measured data are also in agreement with Equation (3) and show that the same current density are obtained at lower macroscopic electric field as the spacing of carbon nanotubes is increased.

One embodiment of the present invention provides studies of shielding effects between individual tubules for field emission and microelectrodes. In a particular embodiment, the field emission characteristics of vertically aligned CNT films are compared following the independent variation of the length and the spacing of the CNTs. The macroscopic electric field $E_{mac,1}$ at the current density of 1 mA/cm² is used as a criterion for comparison. For a given length of carbon nanotubes, $E_{mac,1}$ is decreased as the spacing of carbon nanotubes are increased, and for a given spacing of carbon nanotubes, $E_{mac,1}$ is decreased as the length of carbon nanotubes are increased except for the very high density carbon nanotube film. It is estimated that $E_{mac,1}$ is nearly saturated to be about 3 V/μm when the site density is lower than about $10^6$ cm⁻² and the length is longer than about 10 μm.

Figure 5:
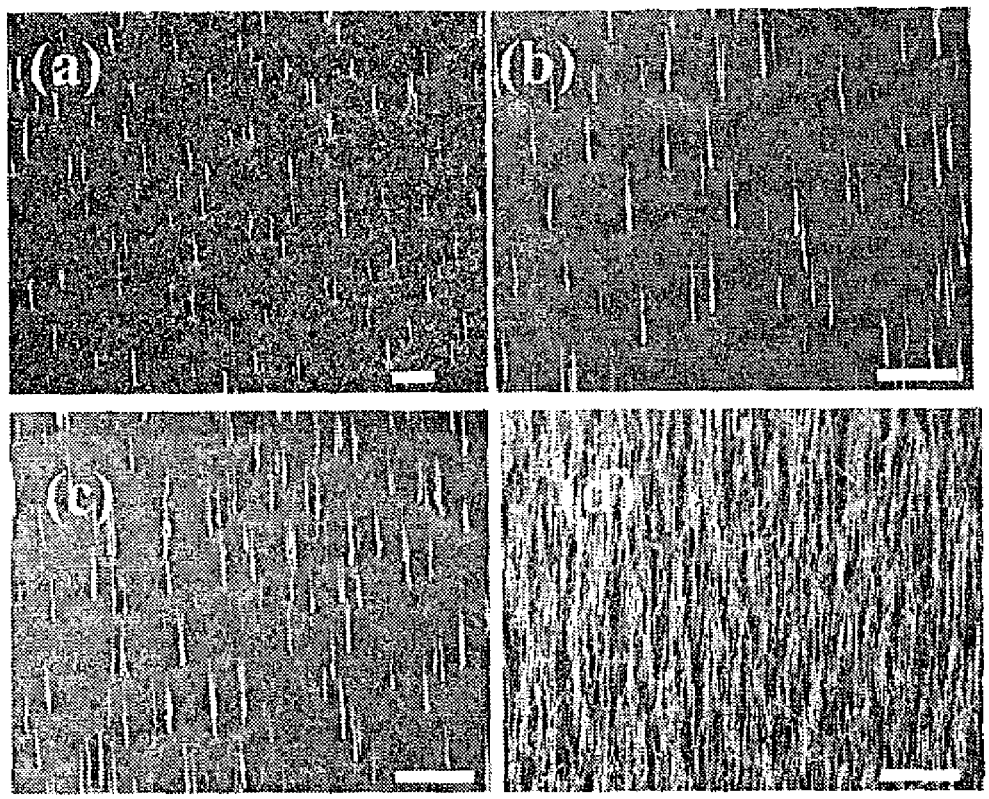
FIG. 5. shows SEM micrographs of CNT arrays with varying site densities. The SEM micrographs are shown at a grazing incidence of 45° to the substrate.
Figure 10:
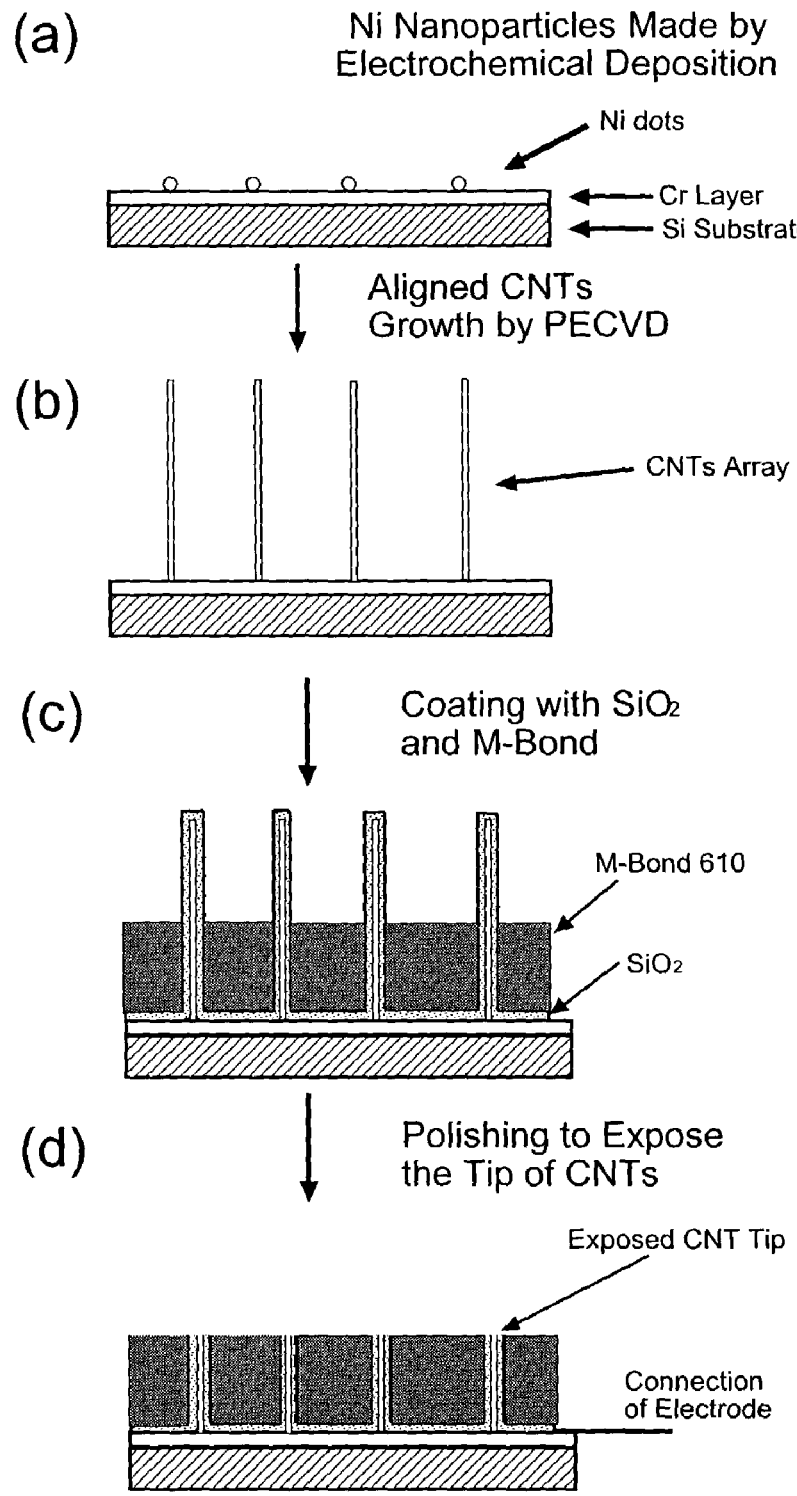
FIG. 10. shows a fabrication scheme for a site density controlled CNT microelectrode array.

In another particular embodiment, multiwall carbon nanotubes are obtained and the diameter of the nanotubes are in the range of 50-80 nm. In one embodiment, 8 samples, Samples A-H, are prepared. FIG. 5 shows four of the SEM micrographs of these samples. The estimated length and site density, from the SEM images, are listed Table 1. The site density of sample H is much higher than any other samples as shown in FIG. 10.

TABLE 1

Length characteristics of carbon nanotube films with varying site densities.

| Sample | Length | Density |
|---|---|---|
| A | 4.0 μm | $6 \times 10^6/cm^2$ |
| B | 5.5 μm | $5 \times 10^6/cm^2$ |
| C | 7.0 μm | $2 \times 10^6/cm^2$ |
| D | 8.5 μm | $1 \times 10^6/cm^2$ |
| E | 10.5 μm | $1 \times 10^6/cm^2$ |
| F | 12.5 μm | $3 \times 10^6/cm^2$ |
| G | 12.5 μm | $6 \times 10^6/cm^2$ |
| H | 8.5 μm | $4 \times 10^7/cm^2$ |

Figure 6:
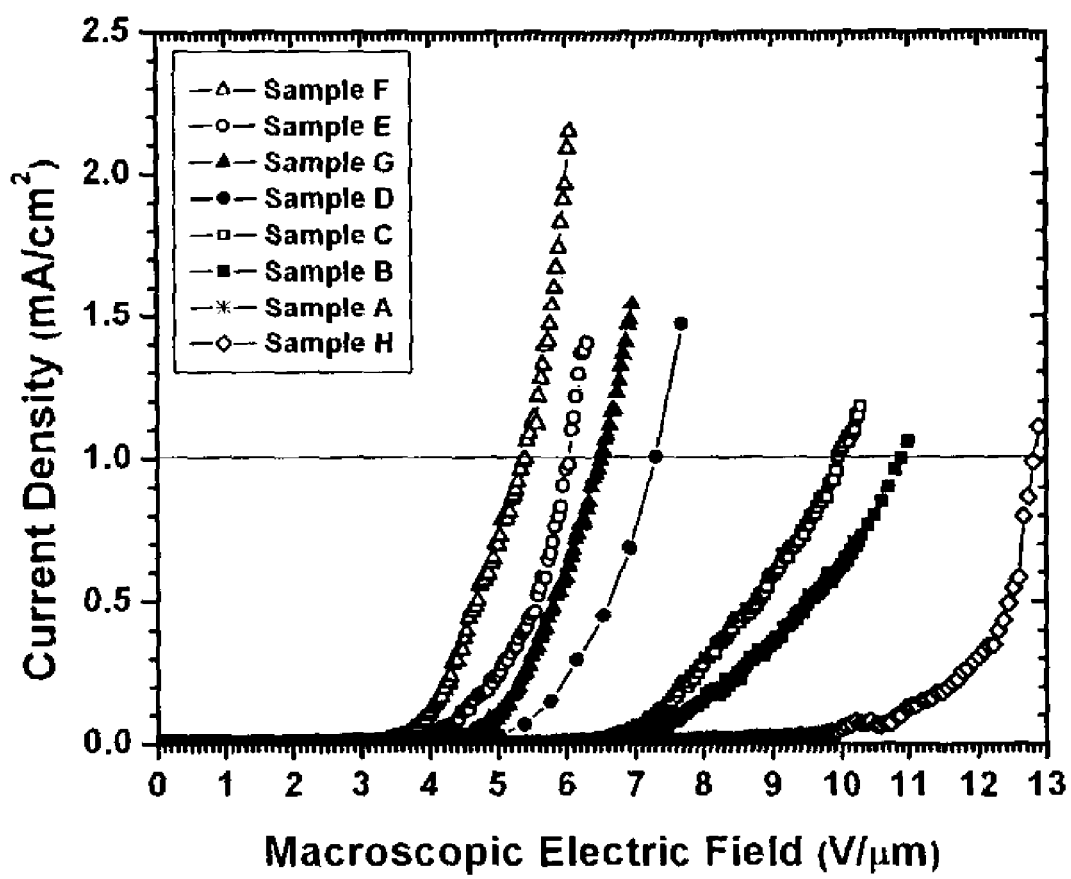
FIG. 6. shows a plot of measured current densities as a function of the macroscopic electric field for samples A-H. Sample A is represented by -*-. Sample B is represented by -■-. Sample C is represented by -□-. Sample D is represented by -●-. Sample E is represented by -○-. Sample F is represented by -▲-. Sample G is represented by -▲-. Sample H is represented by -◇-. The horizontal axis represents Macroscopic Field (V/μm). The vertical axis represents current density (mA/cm$^2$).

The field emission current of samples A-H are measured by the simple diode configuration. The anode is a molybdenum disk with a diameter of 5 mm and the gap between the silicon substrate and the anode is 300 μm. The emission characteristics are of the whole 5 mm diameter area. It should be very close to the value scaled to 1 cm², not like the reports that were scaled up from a tip of less than 0.1 mm diameter. Local properties, i.e. properties of a microscopic area cannot be expressed as a function of the same properties over a larger area (macroscopic area) based on calculations. The measured current densities as a function of the macroscopic electric field are shown in FIG. 6. The dotted line corresponds to the current density of 1 mA/cm² and the values of electric field required to obtain this current density are 10.9, 9.95, 7.30, 6.05, 6.50, 5.40, 12.8 V/μm for samples B through H, respectively. The emission current of sample A does not reach 1 mA/cm² because of short length and high density.

Figure 9:
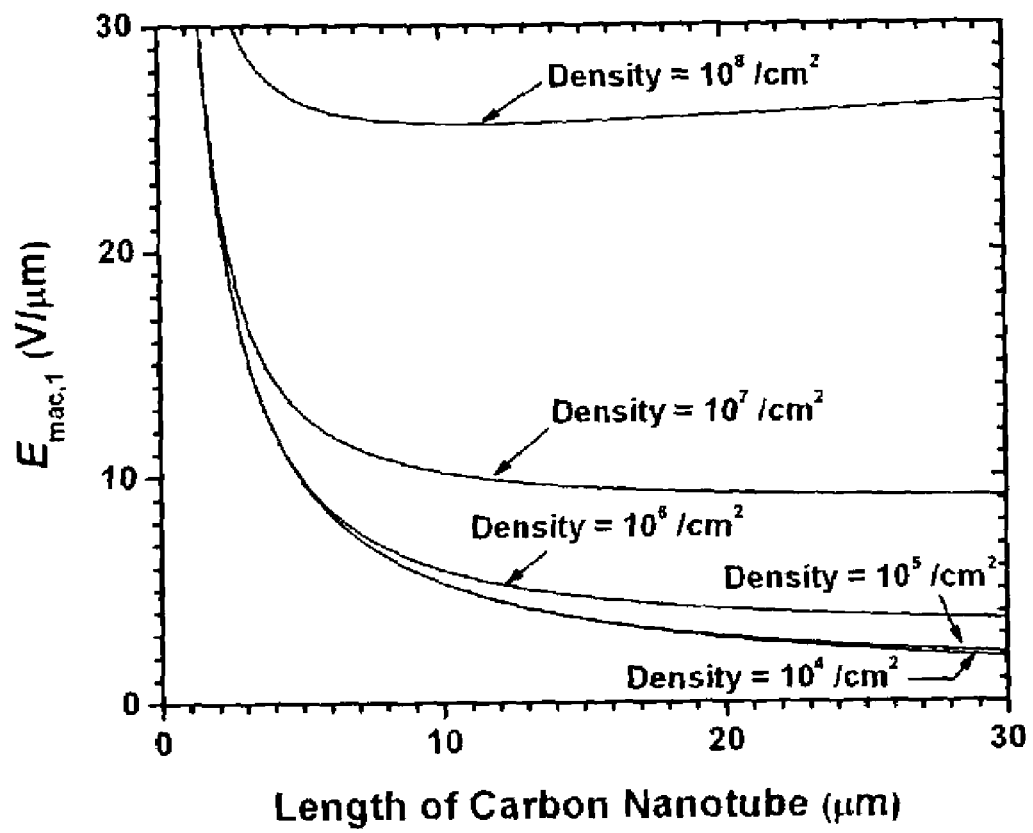
FIG. 9. shows the change in macroscopic electric fields $E_{mac,1}$ at the average current density of 1 mA/cm$^2$ as a function of the length and the density of carbon nanotubes. The horizontal axis represents length of CNTs (μm). The vertical axis represents $E_{mac,1}$ (V/μm).

In FIG. 9, $E_{mac,1}$ is calculated for a wider range of length and spacing using r=8 nm and $E_{local,1}$=3.9 V/nm. From this figure, it can be seen that the increase of spacing does not effectively reduce $E_{mac,1}$ for the short carbon nanotube film. It can also be seen that $E_{mac,1}$ is nearly saturated to be about 3 V/μm when the density is lower than $10^6$ cm⁻² and the length is longer than 10 μm. This means that the increase of the length and spacing effectively reduces $E_{mac,1}$ up to a certain level. In order to decrease $E_{mac,1}$ further, it is required to reduce the diameter of the vertically aligned carbon nanotubes. FIG. 9 shows that $E_{mac,1}$ is increased as the length of carbon nanotubes are increased if the density is very high, for example, $10^8$ cm⁻² or higher. This behavior at very high density is qualitatively in agreement with known results.

Another aspect of the invention relates to microelectrode arrays (MEAs) comprising site density controlled CNT array materials. In particular the present invention relates to MEAs comprising an array of substantially linear CNTs with controllable site densities wherein the arrays are attached to a catalyst substrate material, wherein the carbon nanotubes are aligned with respect to one another within the array.

In one embodiment, the MEAs comprise a) an array of substantially linear CNTs and b) an insulator coating on the surface of the array, wherein the distal ends (tips) of CNT tubules are exposed. In another embodiment, the MEAs optionally further comprise c) an adhesive coating on the surface of the insulator coating. In a preferred embodiment, the insulator or adhesive coating has a polished surface. The MEAs optionally further comprise c) a metal wire attached to the catalyst substrate, preferably at the corner of the catalyst substrate. The MEAs provided by the invention can comprise up to millions of nanoelectrodes from the controlled site density CNT array of the invention. In a preferred embodiment each electrode of the MEA has a diameter of about 100 nm.

Another aspect of the invention relates to methods of producing MEAs comprising site density controlled CNT array materials. In one embodiment, the MEAs are produced by coating the CNT material with an insulator layer. In another embodiment, the MEAs are produced by additionally coating the insulator layer coated CNT material with an adhesive such as the epoxy-phenolic adhesive M-Bond 610™. Optionally, after the insulator layer and/or adhesive layer is applied, the surface of the insulator and/or adhesive coated CNT material is polished. Polishing the coated CNT array materials is utilized to expose the distal ends (tips) of the CNTs if needed. Optionally, an insulated metal wire is attached to the corner of the catalytic substrate of the MEAs. The surface of insulator and/or adhesive coated CNT material can be polished using any suitable means known in the art. In one embodiment a fiber free cloth is used to polish the surface of insulator and/or adhesive coated CNT material.

In one embodiment, the MEAs are produced by coating the CNT material with a $SiO_2$ coating and then coating the $SiO_2$ coated CNT material with an epoxy-phenolic adhesive such as M-Bond 610™. The MEAs provided by the invention can comprise up to millions of nanoelectrodes from the controlled site density CNT array of the invention. In a preferred embodiment each electrode of the MEA has a diameter of about 100 nm. Cyclic voltammetry and square wave voltammetry are used to characterize the carbon MEAs.

MEAs, their production and their physical properties are described in detail by reference to the following figures and diagrams.

FIG. 10 is a scheme representing one embodiment the fabrication procedure of the invention. After electrochemical deposition of Ni microparticles (shown in FIG. 10(a)), an aligned CNTs array is grown (shown in 10(b)), and then a thin layer of $SiO_2$ is coated on the surface by magnetron sputtering to insulate the chromium layer. After applying the $SiO_2$ coating, M-Bond 610™ (Two-component, solvent-thinned, epoxy-phenolic adhesive from Vishay Intertechnology, Inc.), about 5 μm thick, is coated and cured at about 170° C. for about 2 hours, which further insulates the chromium and also provides the mechanical support to the CNTs. After the coating steps, the CNTs are half embedded in the polymer resin as shown in FIG. 10(c). In the next step, a fiber free cloth is used to polish the surface that mechanically breaks the top part of CNTs and exposes the tip of CNTs as shown in FIG. 10(d). The sample surface is then rinsed in deionized water and an insulated copper wire (0.5 mm in radius) is attached to the corner of the substrate by applying a drop of conductive silver epoxy followed by insulating epoxy. The copper wire-MEAs assembly is left to cure in air at room temperature for several hours.

Figure 11:
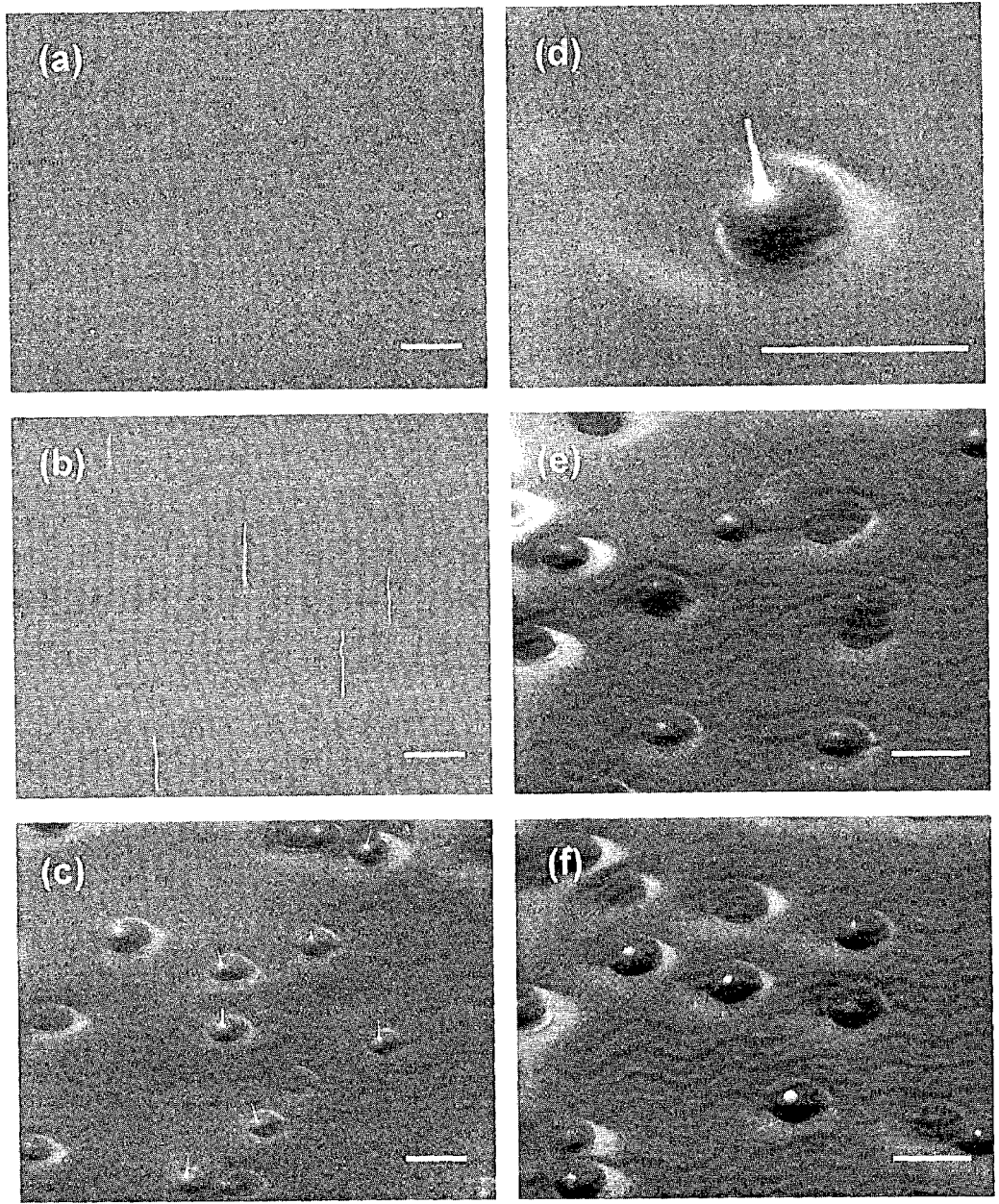
FIG. 11. shows SEM images of the fabrication steps of the microelectrode array.

FIG. 11 shows the SEM images of the MEAs fabrication steps corresponding to the scheme shown in FIG. 10. The bright dots in FIG. 11(a) are the electrodeposited Ni microparticles that are randomly distributed on the substrate. This sample has site density of about $10^6$ $cm^{-2}$ and average inter-spacing of about 10 μm. FIG. 11(b) shows the low site density aligned CNTs array grown by PECVD method from the Ni microparticles. FIG. 11(c) shows the morphology after coating of a thin layer of $SiO_2$ followed by a second layer of epoxy film. The CNTs array are half embedded in the polymer. FIG. 11(d) provides a close-up look at a single half embedded CNT. FIG. 11(e) shows the topography after polishing. It is clearly shown that only the tip of the embedded CNTs is exposed. In order to prove that the tip of the CNTs is exposed and conducting, electrodeposition of the Ni microparticles is repeated on the sample. FIG. 11(f) shows that the Ni microparticles are only deposited on the CNTs tips. This also indicates that the carbon MEAs array could be used as template to fabricate other metal MEAs.

Figure 12:
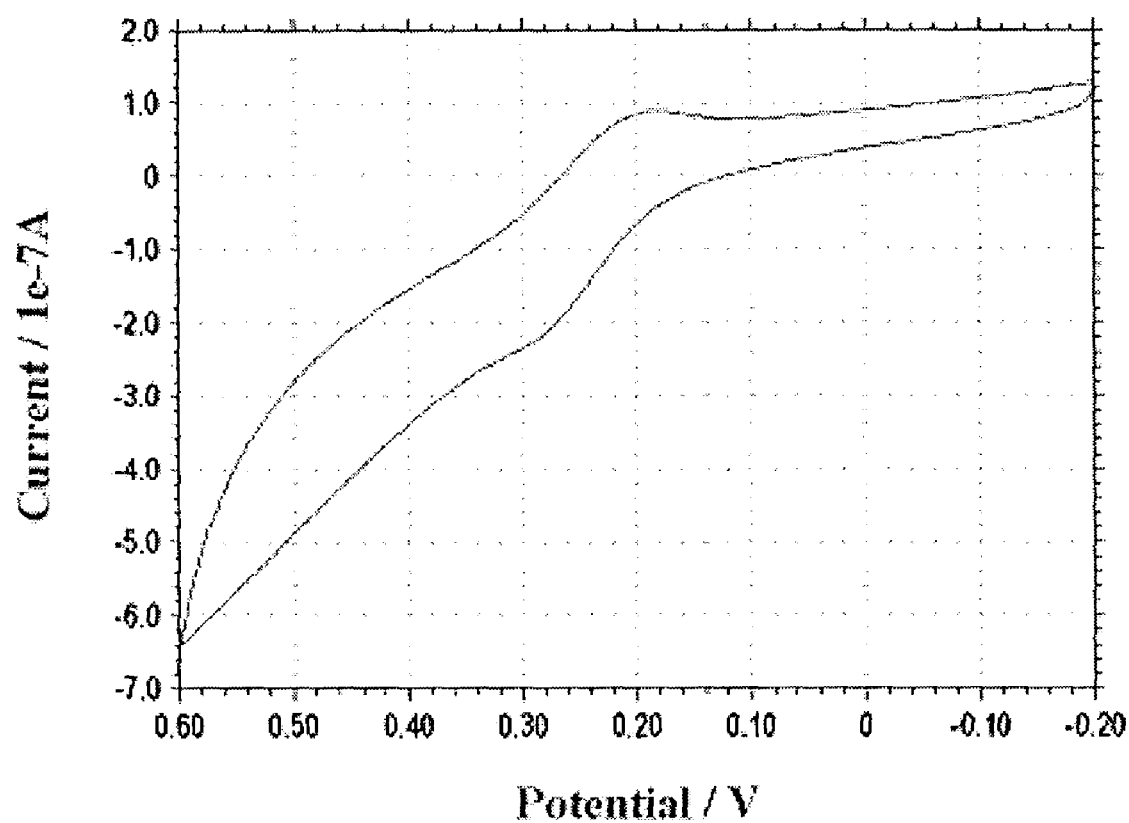
FIG. 12. shows a cyclic voltammetry curve of a controlled density aligned CNT microelectrode array. The curve is taken in solution of 4 mM K$_3$Fe(CN)$_6$ in 0.5 M KNO$_3$. The scan rate is 40 mV/s. The horizontal axis represents length of potential (V). The vertical axis represents current (1e-7A).

FIG. 12 shows the electrochemical characterization of the MEAs. Electrochemical characterization is performed with a CHI 660 electrochemical analyzer (CH Instrument, Austin, Tex.). A one-compartment cell is used with a platinum wire as the auxiliary electrode and Ag/AgCl as the reference electrode. The cyclic voltammetry of $K_3Fe(CN)_6$ is used for the characterization of the MEAs. As shown in FIG. 12, the relative heights of the anodic and cathodic peaks in cyclic voltammogram indicated the reversibility of electrochemical reaction of $Fe(CN)_6^{4-}/Fe(CN)_6^{3-}$ redox couple on native carbon MEAs. The difference between forward and reverse scan deviated from the sigmoid shape expected from microelectrode. This may be due to the partial overlapping of the diffusion layers of individual nanoelectrode, or leakage due to the insufficient passive layer. In addition, the surface condition of the electrode and the scan rate could also affect the result. The signal (in the range of μA) generated from the MEAs of the invention is much higher compared with the signal (a few pA) generated from a couple of carbon nanoelectrodes with similar disk sharp, simply because that the total current for the loosely packed electrode array is proportional to the number of the individual electrode $i_{array} = N \cdot i_{single}$. The need for expensive electronic device for low current detection is avoided.

Figure 13:
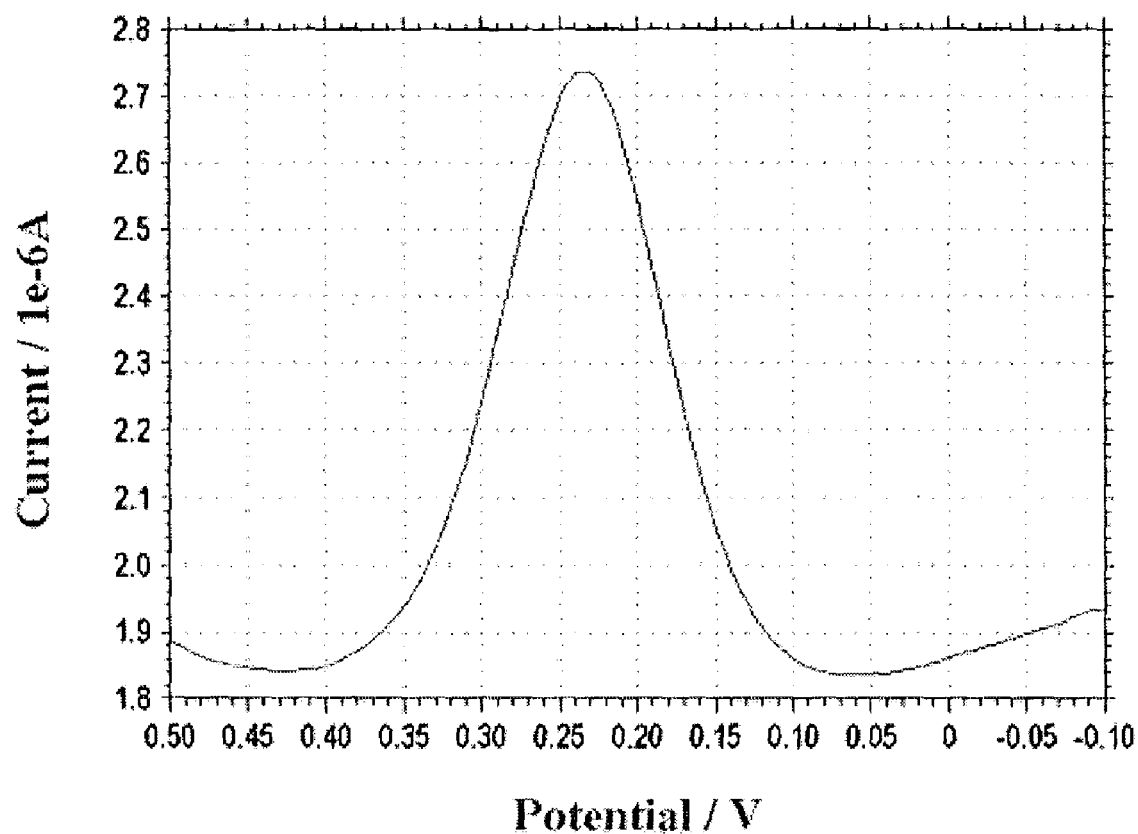
FIG. 13. shows square wave voltammetry characteristics of a controlled density aligned CNT microelectrode array. The curve is taken in solution of 2 mM K$_3$Fe(CN)$_6$ in 0.5 M KNO$_3$. Pulse amplitude, 25 V; step amplitude, 4 mV; frequency, 15 Hz. The horizontal axis represents length of potential (V). The vertical axis represents current (1e-6A).

FIG. 13 shows square wave voltammetry (SWV) characteristics of the MEAs. SWV is a powerful technique for electroanalysis. SWV is a large-amplitude differential technique in which a waveform composed of a symmetrical square wave, superimposed on a base staircase potential, is applied to the working electrode. The main advantages of SWV are speed and low detection limits. SWV can effectively discriminate the signal against the charging background current, enabling the very low detection limits for the analytes. To evaluate the potential applicability of the carbon-MEAs for trace analysis, SWV of $K_3Fe(CN)_6$ is studied. As shown in FIG. 13, a symmetric peak of $K_3Fe(CN)_6$ reduction is obtained. Compared with the CV curve in FIG. 12 charging background current in SWV curve is dramatically reduced.

The CNTs materials having controlled site densities are suitable for use in microelectrode arrays (MEAs). As is evident from FIG. 13 the carbon-MEA's of the present invention can be used for analytical purposes in which charging background current needs to be dramatically reduced, such as for example, metal ion detection in environmental analysis devices and as biosensors. MEAs can also be used as templates to fabricate other metal MEAs.

The CNT materials having controlled site densities, and their method of manufacture, of present invention provides a method of controlling the shielding effect between individual tubules for field emission devices and microelectrode fabrication.

CNTs produced according to the present invention can also be utilized to form composites with other materials, especially dissimilar materials. Suitable dissimilar materials include metals, ceramics, glasses, polymers, graphite, and mixtures thereof. Such composites may be prepared, for example, by coating the products of the present invention with these dissimilar materials either in a solid particulate form or in a liquid form. A variety of polymers, including thermoplastics and resins can be utilized to form composites with the products of the present invention. Such polymers include, for example polyamides, polyesters, polyethers, polyphenylenes, polysulfones, polyurethanes or epoxy resins.

The invention is illustrated by the following examples, which are not intended to be limiting in any way.

EXAMPLES

Example 1

Formation of Ni Microparticles onto a Substrate by Current Electrochemical Deposition The current electrochemical deposition is carried out on a two electrode system. The working electrode is prepared by sputtering a layer of chromium (Cr) onto a silicon (Si) wafer forming a flat, conductive and defect free surface. Gold plate is used as counter electrode. A bath solution of about 0.01 M nickel sulfate ($NiSO_4$) and about 0.01 M boric acid ($H_3BO_3$) in double distilled water is prepared. The solution is weakly acidic. About 1 $cm^2$ of the working electrode surface is exposed to the solution. The distance between the two electrodes is kept at about 1 cm. The chemicals are preferably reagent grade from Aldrich and used as received. A constant current pulse is applied by using a current source and a voltage source. Both the current source and the voltage source are controlled by a computer program. The current electrochemical deposition is at room temperature. The working electrode having deposited nickel (Ni) microparticles is then used as a substrate to form aligned carbon nanotubes.

Example 2

Growth of CNTs Using PECVD

The substrate having Ni microparticles, as described in Example 1, is loaded into a PECVD system described by Z. F. Ren, et al., *Science*, 282, 1105 (1998); Z. P. Huang, et al., *Appl. Phys. A: Mater. Sci. Process*, 74, 387 (2002); and Z. F. Ren et al., *Appl. Phys. Lett.*, 75, 1086 (1999), the contents of which are incorporated herein by reference in their entirety.

The pressure in the system is pumped down to about $2\times10^{-6}$ Torr. About 160 standard cubic centimeter per minute (sccm) ammonia ($NH_3$) gas is then introduced into the chamber and the temperature is increased by applying current on the tungsten (W) filament. About 100 Watts DC plasma is applied for about 10 to about 20 seconds first to pre-etch the nickel (Ni) microparticles, then about 40 sccm acetylene ($C_2H_2$) gas is introduced and the plasma intensity is increased to about 170 W for the aligned CNTs growth. The pressure during growth is kept at about 15 Torr. Both acetylene and ammonia preferably have a minimum purity of about 99.99%. The CNTs growth time is about 5 minutes, and the sample temperature during growth is below about 660° C.

Example 3

Ni microparticles are randomly electrodeposited on 1 $cm^2$ Cr-coated silicon substrate by applying pulse current to the substrate in $NiSO_4$ electrolyte solution. The size and the site density of the Ni microparticles are controlled by the amplitude and the duration of the pulse current. CNTs growth is performed in the plasma enhanced chemical vapor deposition (PECVD) system at temperature of 650° C. for 8 minutes with 160 sccm ammonia ($NH_3$) gas and 40 sccm acetylene ($C_2H_2$) gas with a total pressure of 15 Torr and plasma intensity of 170 Watts. The CNTs are about 8 μm in length and about 100 nm in diameter. The average spacing between nanotubes is about 10 μm that corresponds to a site density of $10^6$ $cm^{-2}$.

Example 4

Analysis of CNTs

Scanning electron microscopy (SEM, JEOL JSM-6340F) is employed to examine the CNTs morphology. Transmission electron microscopy (TEM, JEOL 2010) is used to characterize the structure of the CNTs by standard methods.

All patents, patent applications, and published references cited herein are hereby incorporated by reference in their entirety. While this invention has been particularly illustrated and described with references to particular examples of preferred embodiments thereof, it will be understood by those skilled in the art that various changes in form and details may be made therein without departing from the scope and spirit of the invention encompassed by the appended claims.

What is claimed is:

1. A carbon nanotube material comprising an array of substantially linear carbon nanotubes with pre-determined densities that are attached to a catalyst substrate material including a metallic conductive layer deposited on a non-metallic material and a plurality of catalytic transition metal microparticles deposited upon the metallic conductive layer, wherein individual carbon nanotubes are aligned with respect to one another within said array.

2. The carbon nanotube material of claim 1, wherein the carbon nanotubes have pre-determined densities of up to $1\times10^{12}$ $cm^{-2}$.

3. The carbon nanotube material of claim 1, wherein the non-metallic material is selected from the group consisting of silicon, silica, glass, alumina, quartz and graphite.

4. The carbon nanotube material of claim 1, wherein the non-metallic material is a silicon wafer.

5. The carbon nanotube material of claim 1, wherein the metallic conductive layer comprises a metal, metal alloy or mixture thereof.

6. The carbon nanotube material of claim 1, wherein the metallic conductive layer comprises a metal selected from the group consisting of chromium (Cr), molybdenum (Mo), tungsten (W), ruthenium (Ru), copper (Cu), silver (Ag) and gold (Au).

7. The carbon nanotube material of claim 1, wherein the metallic conductive layer is chromium (Cr).

8. The carbon nanotube material of claim 1, wherein the catalytic transition metal microparticles comprise a catalytic transition metal selected from the group consisting of nickel (Ni), silver (Ag), gold (Au), platinum (Pt), palladium (Pd), iron (Fe), ruthenium (Ru), osmium (Os), cobalt (Co), rhodium (Rh) and iridium (Ir).

9. The carbon nanotube material of claim 1, wherein the catalytic transition metal microparticles comprise nickel (Ni).

10. The carbon nanotube material of claim 1, wherein the catalytic transition metal microparticles have an average diameter ranging from 50 nanometers to 200 nanometers.

11. The carbon nanotube material of claim 1, wherein the catalytic transition metal microparticles have an average diameter ranging from 50 nanometers to 80 nanometers.

12. The carbon nanotube material of claim 1, wherein the carbon nanotubes have a substantially uniform tubule length.

13. The carbon nanotube material of claim 12, wherein the carbon nanotube length ranges between 1 and 100 micrometers.

14. The carbon nanotube material of claim 12, wherein the carbon nanotube length is about 8 micrometers.

15. The carbon nanotube material of claim 1, wherein the carbon nanotubes have a substantially uniform diameter.

16. The carbon nanotube material of claim 15, wherein the carbon nanotube diameter ranges between 50 and 500 nanometers.

17. The carbon nanotube material of claim 15, wherein the carbon nanotube diameter is about 100 nanometers.

18. A method of forming a carbon nanotube material comprising:
forming a catalyst substrate material by depositing a metallic conductive layer on a non-metallic material and depositing a plurality of catalytic transition metal microparticles on the metallic conductive layer; and
contacting said catalyst substrate material with a carbon source gas so as to cause formation of an aligned array of individual carbon nanotubes with pre-determined densities on the surface of said catalyst substrate material.

19. The method of claim 18, further comprising applying a plasma to the catalyst substrate material during formation of the aligned array of individual carbon nanotubes.

20. The method of claim 19, wherein the plasma is direct current plasma.

21. The method of claim 18, wherein said metallic conductive layer forms a substantially uniform surface layer on said non-metallic material.

22. The method of claim 21, further comprising etching the catalyst substrate material.

23. The method of claim 21, wherein the carbon source gas is a saturated, unsaturated linear, branched or cyclic hydrocarbon, or mixture thereof.

24. The method of claim 23, wherein the carbon source gas is selected from the group consisting of acetylene, methane, propane, ethylene, benzene.

25. The method of claim 24, wherein the carbon source gas is acetylene.

26. The method of claim 18, wherein the metallic conductive layer is deposited on the non-metallic material by magnetron sputtering.

27. The method of claim 21, wherein the catalytic transition metal microparticles are deposited on the layer of metallic conductive layer by a pulse-current electrochemical deposition process.

28. The method of claim 27, wherein the pulse-current electrochemical deposition process comprises an electrolytic solution comprising a transition metal salt and a mineral acid.

29. The method of claim 27, wherein the pulse-current electrochemical deposition process comprises utilizing an electrolytic solution comprising nickel sulfate ($NiSO_4$) and boric acid ($H_3BO_3$).

30. The method of claim 18, wherein the carbon nanotubes have pre-determined densities of up to about $1\times10^{12}$ $cm^{-2}$.

31. The method of claim 18, wherein the non-metallic material is selected from the group consisting of silicon, silica, glass, alumina, quartz and graphite.

32. The method of claim 18, wherein the non-metallic material is a silicon wafer.

33. The method of claim 18, wherein the metallic conductive layer comprises a metal, metal alloy or mixture thereof.

34. The method of claim 18, wherein the metallic conductive layer comprises a metal selected from the group consisting of chromium (Cr), molybdenum (Mo), tungsten (W), ruthenium (Ru), copper (Cu), silver (Ag) and gold (Au).

35. The method of claim 18, wherein the metallic conductive layer is chromium (Cr).

36. The method of claim 21, wherein the catalytic transition metal microparticles comprise a catalytic transition metal selected from the group consisting of nickel (Ni), silver (Ag), gold (Au), platinum (Pt), palladium (Pd), iron (Fe), ruthenium (Ru), osmium (Os), cobalt (Co), rhodium (Rh) and iridium (Ir).

37. The method of claim 21, wherein the catalytic transition metal microparticles comprise nickel (Ni).

38. The method of claim 21, wherein the microparticles have an average diameter ranging between 50 nanometers and 200 nanometers.

39. The method of claim 21, wherein the microparticles have an average diameter ranging between 50 nanometers and 80 nanometers.

40. The method of claim 18, wherein the carbon nanotubes have a substantially uniform tubule length.

41. The method of claim 40, wherein the carbon nanotube length ranges from 1 to 100 micrometers.

42. The method of claim 40, wherein the carbon nanotubes length is about 8 micrometers.

43. The method of claim 18, wherein the carbon nanotubes have a substantially uniform diameter.

44. The method of claim 43, wherein the carbon nanotube diameter ranges between 50 and 500 nanometers.

45. The method of claim 43, wherein the carbon nanotube diameter is about 100 nanometers.

46. A carbon nanotube material comprising a plurality of individual carbon nanotubes engaged to a catalyst substrate material including a metallic conductive layer, a non-metallic material and a plurality of catalytic transition metal microparticles deposited upon the metallic conductive layer, wherein the carbon nanotubes are substantially linear and aligned with pre-determined densities.

47. The carbon nanotube material of claim 46, wherein the catalytic transition metal microparticles deposited upon the metallic conductive layer result in the fabrication of substantially linear individual carbon nanotubes.

48. The carbon nanotube material of claim 46, wherein the plurality of carbon nanotubes have pre-determined densities of up to $1\times10^{12}$ $cm^{-2}$.

49. The carbon nanotube material of claim 46, wherein the non-metallic material is selected from the group consisting of silicon, silica, glass, alumina, quartz and graphite.

50. The carbon nanotube material of claim 46, wherein the non-metallic material is a silicon wafer.

51. The carbon nanotube material of claim 46, wherein the metallic conductive layer comprises a metal, metal alloy or mixture thereof.

52. The carbon nanotube material of claim 46, wherein the metallic conductive layer comprises a metal selected from the group consisting of chromium (Cr), molybdenum (Mo), tungsten (W), ruthenium (Ru), copper (Cu), silver (Ag) and gold (Au).

53. The carbon nanotube material of claim 46, wherein the metallic conductive layer is chromium (Cr).

54. The carbon nanotube material of claim 47, wherein the catalytic transition metal microparticles comprise a catalytic transition metal selected from the group consisting of nickel (Ni), silver (Ag), gold (Au), platinum (Pt), palladium (Pd), iron (Fe), ruthenium (Ru), osmium (Os), cobalt (Co), rhodium (Rh) and iridium (Ir).

55. The carbon nanotube material of claim 47, wherein the catalytic transition metal microparticles comprise nickel (Ni).

56. The carbon nanotube material of claim 47, wherein the catalytic transition metal microparticles have an average diameter ranging from about 50 nanometers to about 200 nanometers.

57. The carbon nanotube material of claim 47, wherein the catalytic transition metal microparticles have an average diameter ranging from about 50 nanometers to about 80 nanometers.

58. The carbon nanotube material of claim 46, wherein the plurality of individual carbon nanotubes have a substantially uniform tubule length.

59. The carbon nanotube material of claim 58, wherein the length of the plurality of individual carbon nanotubes ranges between about 1 and about 100 micrometers.

60. The carbon nanotube material of claim 58, wherein the length of the plurality of individual carbon nanotubes is about 8 micrometers.

61. The carbon nanotube material of claim 46, wherein the plurality of individual carbon nanotubes have a substantially uniform diameter.

62. The carbon nanotube material of claim 61, wherein the diameter of the plurality of individual carbon nanotubes ranges between about 50 and about 500 nanometers.

63. The carbon nanotube material of claim 61, wherein the diameter of the plurality of individual carbon nanotubes is about 100 nanometers.

64. The carbon nanotube material of claim 46, wherein the pre-determined densities of the plurality of individual carbon nanotubes defines the inter-tubule distance between the individual carbon nanotubes.

65. The carbon nanotube material of claim 64, wherein each of the plurality of individual carbon nanotubes has a diameter that is smaller than the intertubule distance between each individual carbon nanotube, resulting in each carbon nanotube working as an individual nanoelectrode.

66. A carbon nanotube material comprising a plurality of individual carbon nanotubes engaged to a catalyst substrate material including a metallic conductive layer, a non-metallic material and plurality of catalytic transition metal microparticles deposited upon the metallic conductive layer, wherein the carbon nanotubes are substantially liner with pre-determined densities.

67. The carbon nanotube material of claim 66, wherein the plurality of carbon nanotubes have pre-determined densities of up to $1 \times 10^{12}$ cm$^{-2}$.

68. The carbon nanotube material of claim 66, wherein the non-metallic material is selected from the group consisting of silicon, silica, glass, alumina, quartz and graphite.

69. The carbon nanotube material of claim 66, wherein the non-metallic material is a silicon wafer.

70. The carbon nanotube material of claim 66, wherein the metallic conductive layer comprises a metal, metal alloy or mixture thereof.

71. The carbon nanotube material of claim 66, wherein the metallic conductive layer comprises a metal selected from the group consisting of chromium (Cr), molybdenum (Mo), tungsten (W), ruthenium (Ru), copper (Cu), silver (Ag) and gold (Au).

72. The carbon nanotube material of claim 66, wherein the metallic conductive layer is chromium (Cr).

73. The carbon nanotube material of claim 66, wherein the catalytic transition metal microparticles comprise a catalytic transition metal selected from the group consisting of nickel (Ni), silver (Ag), gold (Au), platinum (Pt), palladium (Pd), iron (Fe), ruthenium (Ru), osmium (Os), cobalt (Co), rhodium (Rh) and iridium (Ir).

74. The carbon nanotube material of claim 66, wherein the catalytic transition metal microparticles comprise nickel (Ni).

* * * * *